(12) United States Patent
Aggarwal et al.

(10) Patent No.: US 12,063,865 B2
(45) Date of Patent: Aug. 13, 2024

(54) METHOD OF MANUFACTURING INTEGRATED CIRCUIT USING ENCAPSULATION DURING AN ETCH PROCESS

(71) Applicant: Everspin Technologies, Inc., Chandler, AZ (US)

(72) Inventors: Sanjeev Aggarwal, Scottsdale, AZ (US); Sarin A. Deshpande, San Jose, CA (US); Kerry Joseph Nagel, Scottsdale, AZ (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 27 days.

(21) Appl. No.: 16/989,155

(22) Filed: Aug. 10, 2020

(65) Prior Publication Data

US 2020/0373481 A1  Nov. 26, 2020

Related U.S. Application Data

(63) Continuation of application No. 16/576,039, filed on Sep. 19, 2019, now Pat. No. 10,777,738, which is a
(Continued)

(51) Int. Cl.
*H10N 50/01* (2023.01)
*H10B 61/00* (2023.01)

(52) U.S. Cl.
CPC ............. *H10N 50/01* (2023.02); *H10B 61/00* (2023.02); *H10B 61/22* (2023.02)

(58) Field of Classification Search
CPC ..... H01L 43/12; H01L 27/222; H01L 27/228; H10N 50/01; H10B 61/00; H10B 61/22
See application file for complete search history.

(56) References Cited

U.S. PATENT DOCUMENTS 6,806,546 B2  10/2004  Liu et al.
6,829,162 B2  12/2004  Hosotani
(Continued)

FOREIGN PATENT DOCUMENTS

CN   1308317 A   8/2001
CN   1812150 A   8/2006
(Continued)

OTHER PUBLICATIONS

European Search Report issued in European Application EP18773892.7 on Sep. 28, 2021 (9 pages).
(Continued)

*Primary Examiner* — Shih Tsun A Chou

(74) *Attorney, Agent, or Firm* — Bookoff McAndrews, PLLC

(57) ABSTRACT

A method of fabricating a magnetoresistive bit from a magnetoresistive stack includes etching through a first portion of the magnetoresistive stack using a first etch process to form one or more sidewalls. At least a portion of the sidewalls includes redeposited material after the etching. The method also includes modifying at least a portion of the redeposited material on the sidewalls, and etching through a second portion of the magnetoresistive stack after the modifying step. The magnetoresistive stack may include a first magnetic region, an intermediate region disposed over the first magnetic region, and a second magnetic region disposed over the intermediate region.

22 Claims, 10 Drawing Sheets

Related U.S. Application Data continuation of application No. 16/107,543, filed on Aug. 21, 2018, now Pat. No. 10,461,251.

(60) Provisional application No. 62/549,131, filed on Aug. 23, 2017.

(56) References Cited

U.S. PATENT DOCUMENTS

| | | | |
|---|---|---|---|
| 6,897,532 | B1 | 5/2005 | Schwarz et al. |
| 6,984,529 | B2 | 1/2006 | Stojakovic et al. |
| 6,985,384 | B2 | 1/2006 | Costrini et al. |
| 7,001,783 | B2 | 2/2006 | Costrini et al. |
| 7,097,777 | B2 | 8/2006 | Costrini et al. |
| 7,112,861 | B2 | 9/2006 | Kanakasabapathy et al. |
| 7,122,854 | B2 | 10/2006 | Fukuzumi |
| 7,863,060 | B2 | 1/2011 | Belen et al. |
| 7,936,027 | B2 | 5/2011 | Xiao et al. |
| 8,119,424 | B2 | 2/2012 | Mather et al. |
| 8,133,745 | B2 | 3/2012 | Zhong et al. |
| 8,236,578 | B2 | 8/2012 | Mather et al. |
| 8,685,756 | B2 | 4/2014 | Aggarwal et al. |
| 8,686,484 | B2 | 4/2014 | Whig et al. |
| 8,709,956 | B2 | 4/2014 | Satoh et al. |
| 8,722,543 | B2 | 5/2014 | Belen et al. |
| 8,747,680 | B1 | 6/2014 | Deshpande et al. |
| 8,981,502 | B2 | 3/2015 | Chen et al. |
| 9,093,640 | B2 | 7/2015 | Aggarwal et al. |
| 9,117,924 | B2* | 8/2015 | Kitagawa .......... H01L 29/66007 |
| 9,136,464 | B1 | 9/2015 | Whig et al. |
| 9,166,155 | B2 | 10/2015 | Deshpande et al. |
| 9,269,894 | B2 | 2/2016 | Mudivarthi et al. |
| 9,306,157 | B2 | 4/2016 | Deshpande et al. |
| 9,419,208 | B2 | 8/2016 | Whig et al. |
| 9,548,442 | B2 | 1/2017 | Aggarwal et al. |
| 9,590,171 | B2 | 3/2017 | Lee et al. |
| 9,698,341 | B2 | 7/2017 | Deshpande et al. |
| 9,793,470 | B2 | 10/2017 | Deshpande et al. |
| 9,865,804 | B2 | 1/2018 | Deshpande et al. |
| 10,297,746 | B2 | 5/2019 | Wang et al. |
| 10,461,251 | B2 | 10/2019 | Aggarwal et al. |
| 10,777,738 | B2* | 9/2020 | Aggarwal .......... H01L 27/222 |
| 2001/0040778 | A1 | 11/2001 | Abraham et al. |
| 2002/0146851 | A1 | 10/2002 | Okazawa et al. |
| 2003/0184919 | A1 | 10/2003 | Lin et al. |
| 2003/0197984 | A1 | 10/2003 | Inomata et al. |
| 2003/0219912 | A1 | 11/2003 | Chen et al. |
| 2004/0063223 | A1 | 4/2004 | Costrini et al. |
| 2004/0084400 | A1 | 5/2004 | Costrini et al. |
| 2004/0150922 | A1 | 8/2004 | Kagami et al. |
| 2005/0051820 | A1 | 3/2005 | Stojakovic et al. |
| 2005/0079638 | A1 | 4/2005 | Drewes et al. |
| 2005/0185459 | A1* | 8/2005 | Fukuzumi ................ H01L 43/12 257/E27.005 |
| 2005/0276099 | A1 | 12/2005 | Horng et al. |
| 2007/0000120 | A1 | 1/2007 | Blanchard |
| 2007/0081279 | A1* | 4/2007 | Hong .................. G01R 33/093 360/324.1 |
| 2008/0265347 | A1 | 10/2008 | Iwayama et al. |
| 2009/0007416 | A1 | 1/2009 | Contreras et al. |
| 2009/0159563 | A1 | 6/2009 | Jung |
| 2010/0020592 | A1 | 1/2010 | Hosotani et al. |
| 2010/0053823 | A1 | 3/2010 | Iwayama et al. |
| 2010/0102407 | A1* | 4/2010 | Kajiyama ............... H01L 43/08 257/E29.323 |
| 2010/0178714 | A1 | 7/2010 | Cho et al. |
| 2010/0193784 | A1* | 8/2010 | Morosawa .......... H01L 29/7869 257/E29.296 |
| 2010/0304504 | A1 | 12/2010 | Shinde et al. |
| 2010/0311243 | A1 | 12/2010 | Mao |
| 2011/0233697 | A1 | 9/2011 | Kajiyama |
| 2011/0235217 | A1 | 9/2011 | Chen et al. |
| 2012/0135543 | A1 | 5/2012 | Shin et al. |
| 2013/0146997 | A1 | 6/2013 | Lee et al. |
| 2013/0244344 | A1 | 9/2013 | Malmhall et al. |
| 2013/0313506 | A1* | 11/2013 | Murayama ............. H10N 50/01 257/4 |
| 2014/0021426 | A1 | 1/2014 | Lee et al. |
| 2014/0084398 | A1 | 3/2014 | Oguz et al. |
| 2014/0170778 | A1 | 6/2014 | Ikeda |
| 2014/0220707 | A1 | 8/2014 | Aggarwal et al. |
| 2014/0227801 | A1 | 8/2014 | Hsu et al. |
| 2014/0315329 | A1 | 10/2014 | Deshpande et al. |
| 2015/0102006 | A1 | 4/2015 | Mudivarthi et al. |
| 2015/0357560 | A1* | 12/2015 | Mudivarthi ............ H01J 43/12 438/3 |
| 2015/0380640 | A1 | 12/2015 | Deshpande et al. |
| 2016/0027999 | A1 | 1/2016 | Pinarbasi |
| 2016/0225981 | A1* | 8/2016 | Deshpande .......... H01L 43/12 |
| 2017/0148976 | A1 | 5/2017 | Annunziata et al. |
| 2017/0222139 | A1 | 8/2017 | Nishimura et al. |
| 2018/0123029 | A1 | 5/2018 | Park et al. |
| 2019/0103554 | A1 | 4/2019 | Aggarwal et al. |

FOREIGN PATENT DOCUMENTS

| | | |
|---|---|---|
| CN | 101901868 A | 12/2010 |
| JP | 2008294420 A | 12/2008 |
| WO | 2004040602 A2 | 5/2004 |

OTHER PUBLICATIONS

Andre, Thomas W. et al., "A 4-Mb 0.18-um 1T1MTJ Toggle MRAM with Balanced Three Input Sensing Scheme and Locally Mirrored Unidirectional Write Drivers," IEEE Journal of Solid-State Circuits, vol. 40, No. 1, pp. 301-309, Jan. 2005.

International Search Report on Patentability and Written Opinion issued in International Application No. PCT/US2018/047339, dated Feb. 26, 2019 (20 pages).

* cited by examiner

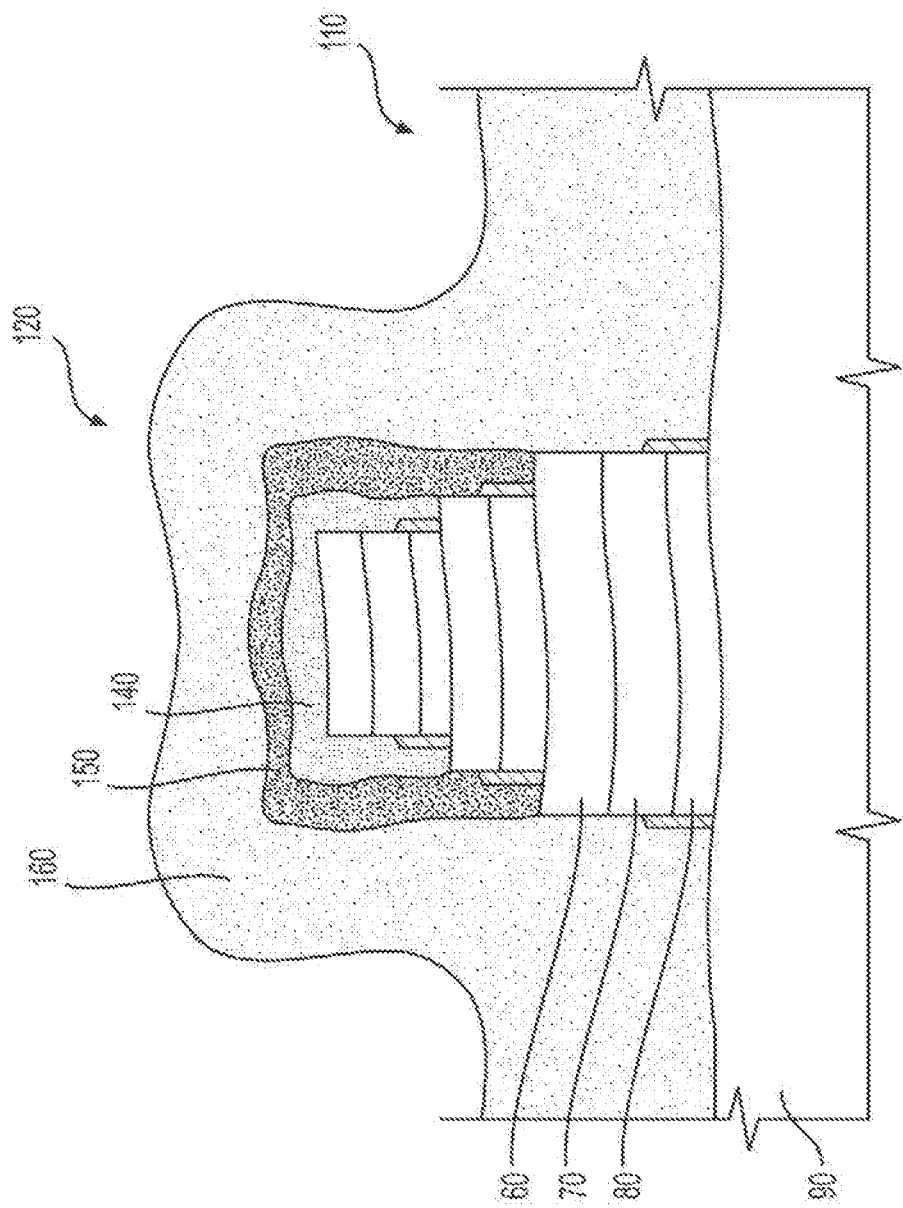

METHOD OF MANUFACTURING INTEGRATED CIRCUIT USING ENCAPSULATION DURING AN ETCH PROCESS

CROSS-REFERENCE TO RELATED APPLICATIONS

This application is a continuation of and claims the benefit of priority to U.S. application Ser. No. 16/576,039, filed Sep. 19, 2019, which is a continuation of and claims the benefit of priority to U.S. application Ser. No. 16/107,543, filed Aug. 21, 2018, now U.S. Pat. No. 10,461,251, issued Oct. 29, 2019, which claims the benefit of U.S. Provisional Application No. 62/549,131, filed Aug. 23, 2017, the entireties of which are incorporated herein by reference.

TECHNICAL FIELD

The present disclosure relates to, among other things, embodiments and aspects related to the manufacturing of an integrated circuit device and the devices resulting therefrom.

INTRODUCTION

There are many inventions described and illustrated herein, as well as many aspects and embodiments of those inventions. In one aspect, the present disclosure relates to methods of manufacturing an integrated circuit device and the devices resulting therefrom. To describe aspects of the disclosed method, an exemplary method of manufacturing a magnetoresistive device (for example, a magnetoresistive memory, magnetoresistive sensor/transducer, etc.) from a magnetoresistive stack/structure is described herein. However, this is only exemplary, and the disclosed method can be applied to manufacture any integrated circuit device.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments. For ease of illustration, the figures depict the different regions along the thickness of the illustrated stacks as a layer having well defined boundaries with straight edges (i.e., depicted using lines). However, one skilled in the art would understand that, in reality, at an interface between adjacent regions or layers, the materials of these regions alloy together, or migrate into one or the other material, and make their boundaries ill-defined or diffuse. That is, although multiple layers with distinct interfaces are illustrated in the figures, in some cases, over time and/or exposure to high temperatures, materials of some of the layers may migrate into or interact with materials of other layers to present a more diffuse interface between these layers. Further, although the figures illustrate each region or layer as having a relatively uniform thickness across its width, a skilled artisan would recognize that, in reality, the different regions may have a non-uniform thickness (e.g., the thickness of a layer may vary along the width of the layer).

In the figures and description, details of well-known features (e.g., interconnects, etc.) and manufacturing techniques (e.g., deposition techniques, etching techniques, etc.) may be omitted for the sake of brevity (and to avoid obscuring other features), since these features/technique are well known to a skilled artisan. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and to describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in reality, such regions/layers may be more "rounded" and/or gradually sloping. It should also be noted that, even if it is not specifically mentioned, aspects described with reference to one embodiment may also be applicable to, and may be used with, other embodiments.

Figure 1:
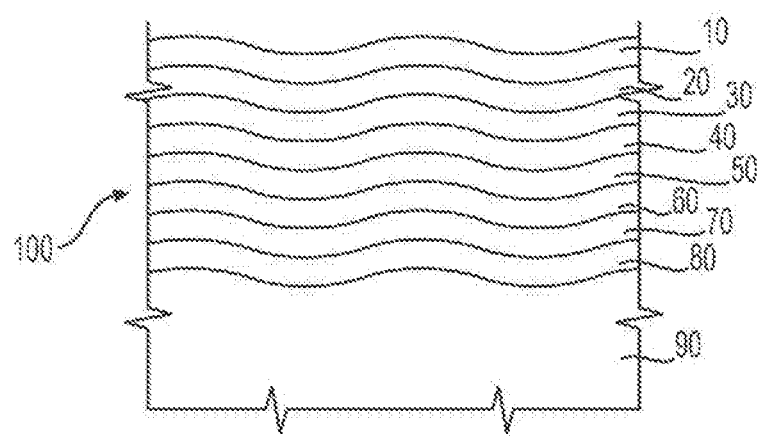
Figure 2:
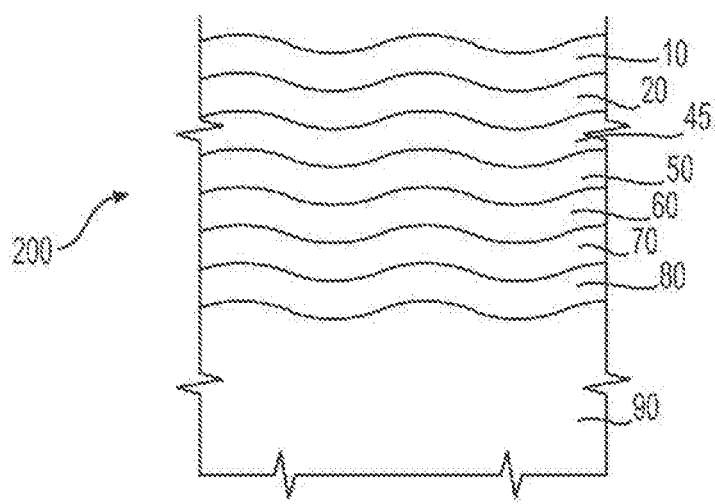
Figure 3:
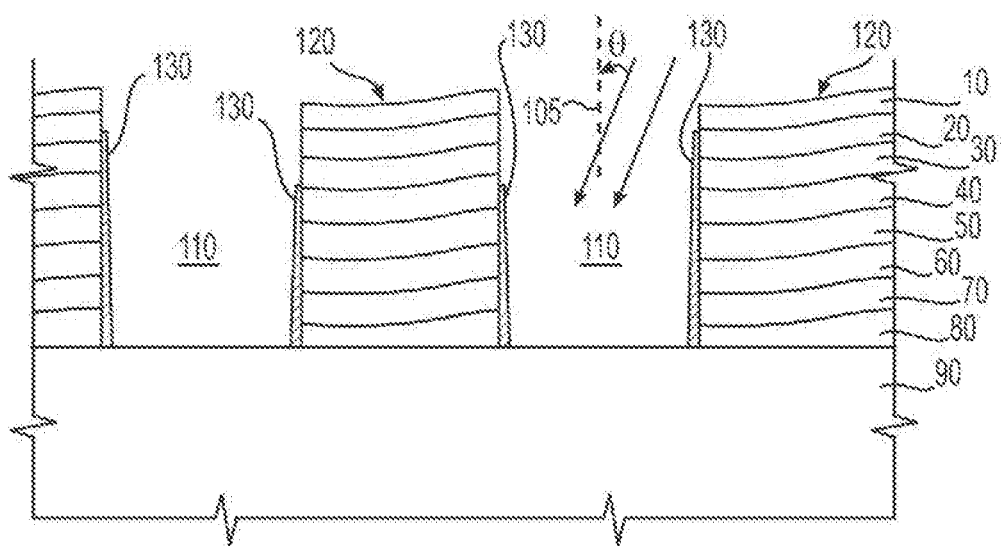
Figure 6A:
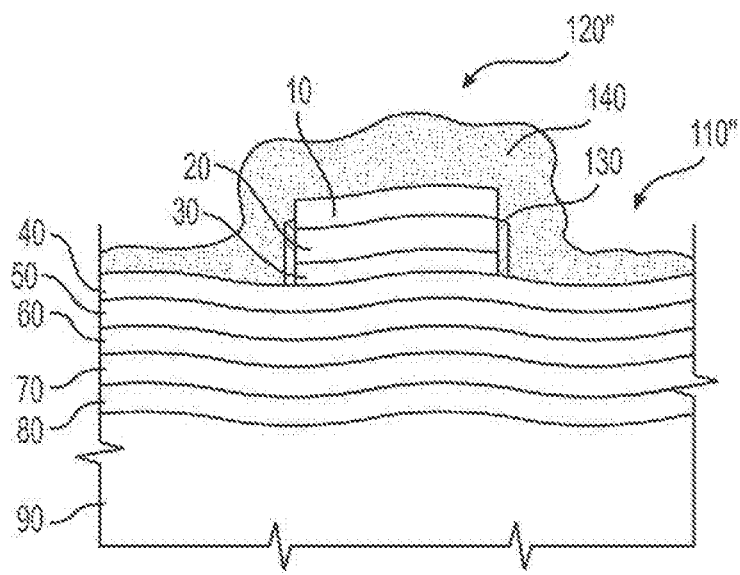
Figure 6B:
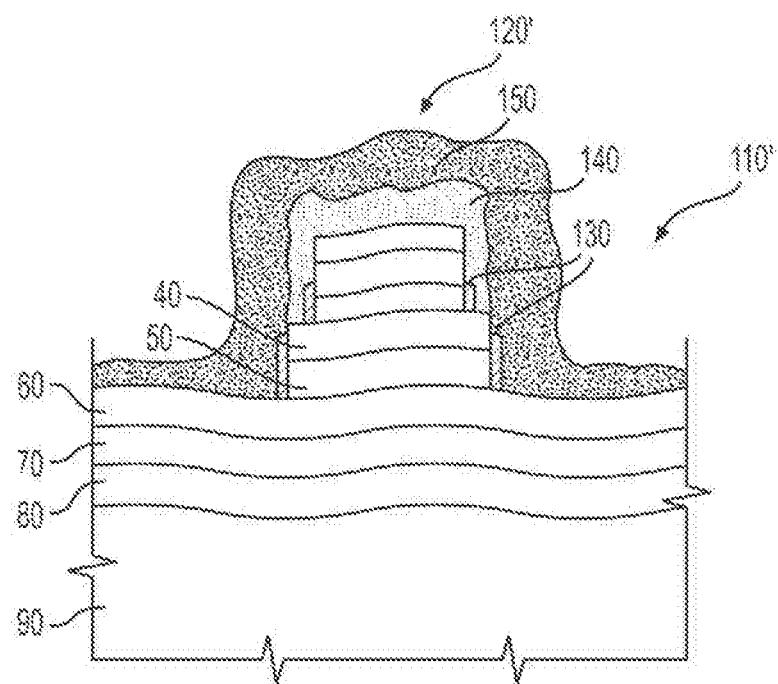
Figure 7A:
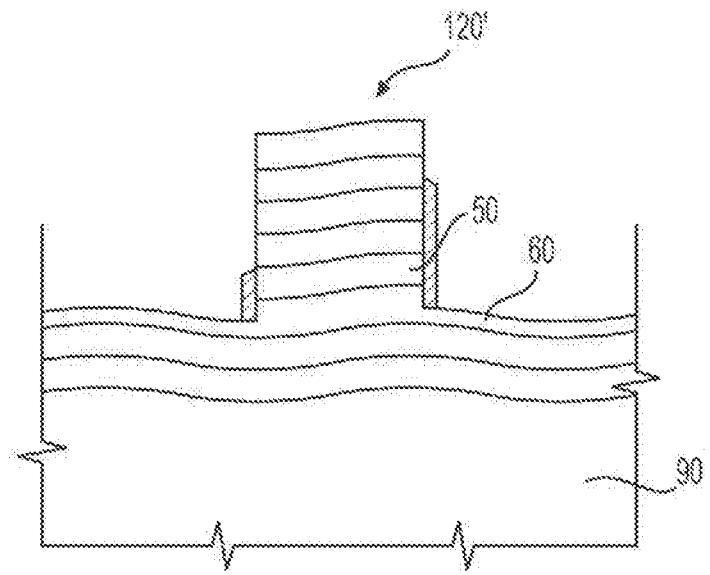
Figure 7B:
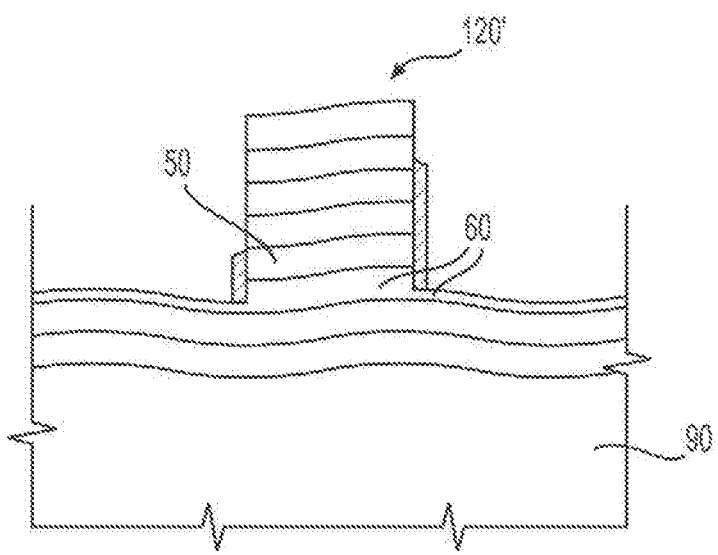
Figure 9A:
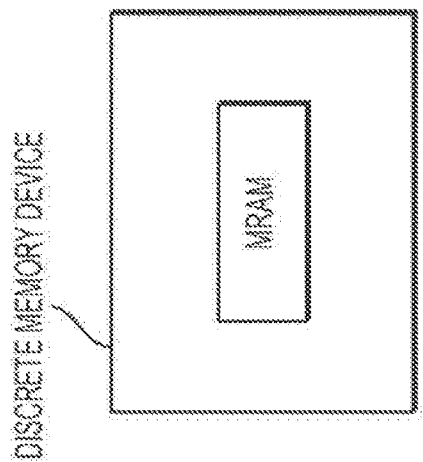
Figure 9B:
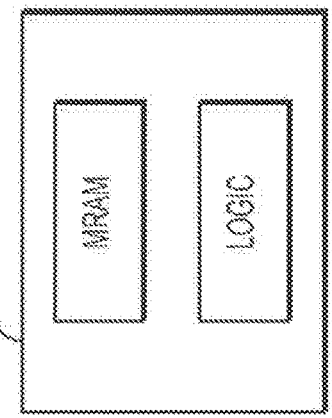
Figure 8:
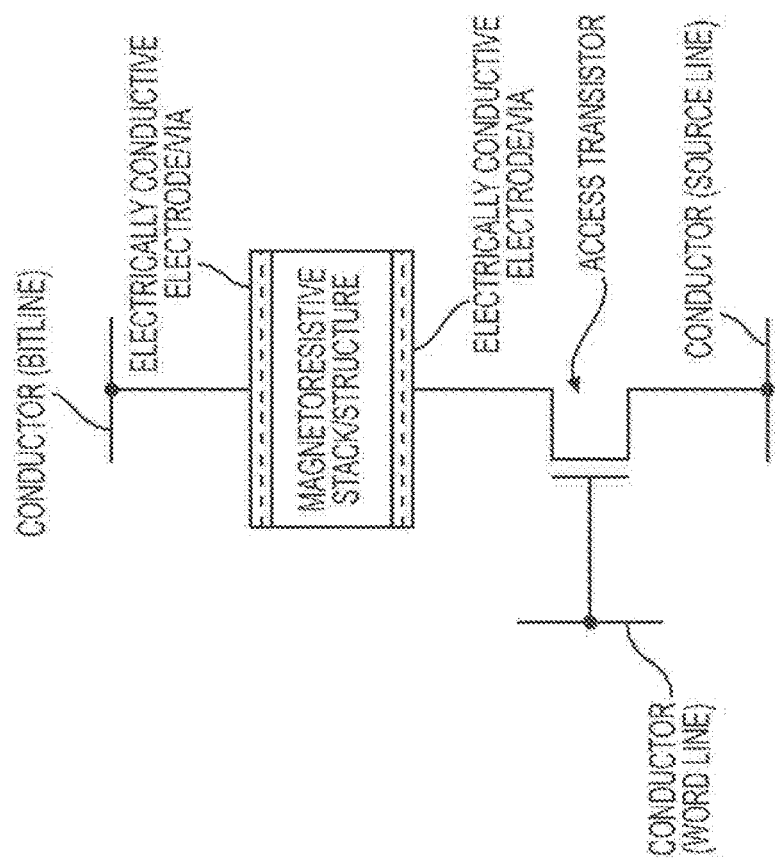
Figure 10:
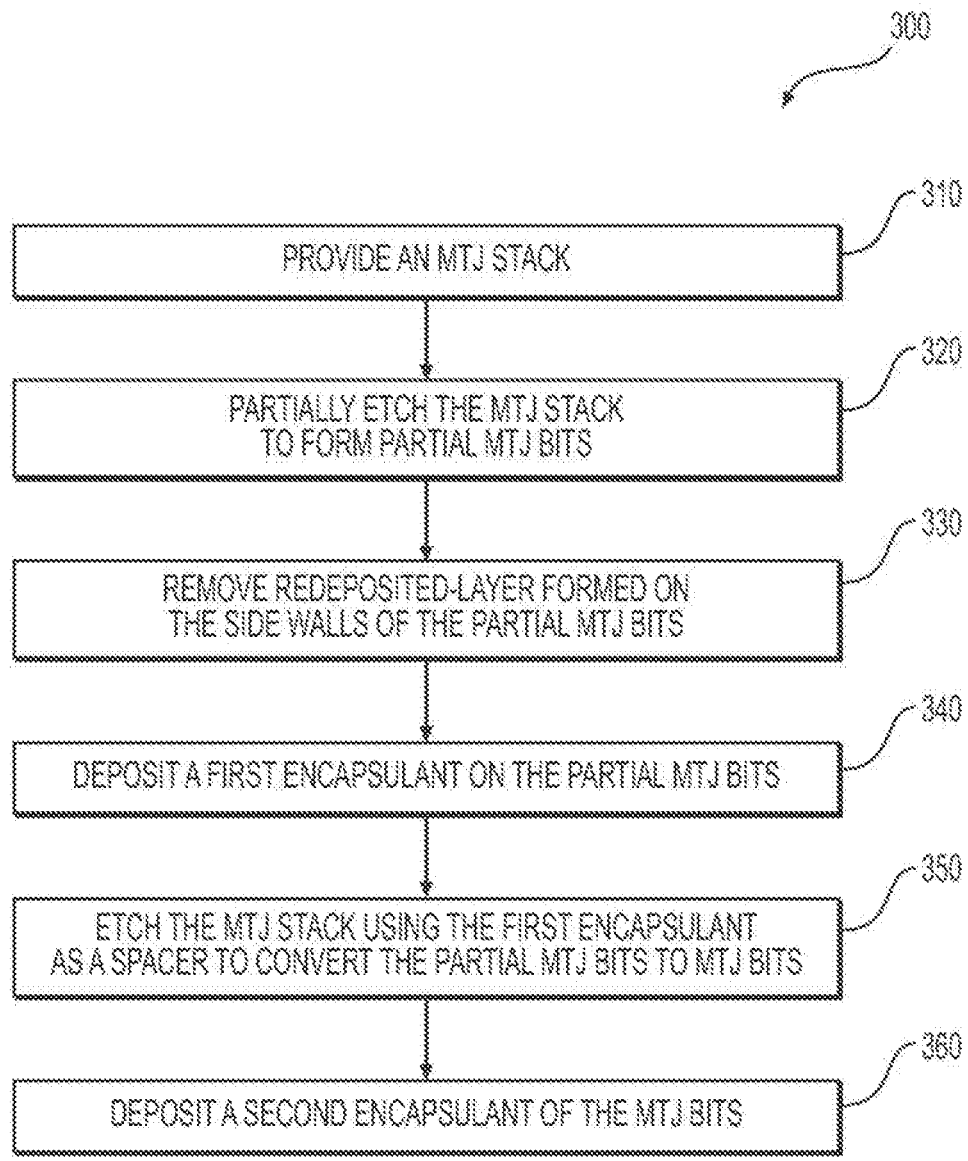

FIG. 1 is a cross-sectional schematic illustration of the structure of an exemplary magnetoresistive stack/structure of the current disclosure;

FIG. 2 is a cross-sectional schematic illustration of the structure of another exemplary magnetoresistive stack/structure of the current disclosure;

FIG. 3 is a cross-sectional schematic illustration of an exemplary magnetoresistive device formed from the magnetoresistive stack/structure of FIG. 1;

FIGS. 4A-4E are cross-sectional schematic illustrations of the magnetoresistive stack/structure of FIG. 1 after various steps during the fabrication of an exemplary magnetoresistive device;

FIGS. 5A-5E are cross-sectional schematic illustrations of the magnetoresistive stack/structure of FIG. 2 after various exemplary steps during the fabrication of an exemplary magnetoresistive device;

FIGS. 6A-6C are cross-sectional schematic illustrations of the magnetoresistive stack/structure of FIG. 1 after various exemplary steps during the fabrication of another exemplary magnetoresistive device;

FIGS. 7A and 7B are cross-sectional schematic illustrations of the magnetoresistive stack/structure of FIG. 1 after various exemplary steps during the fabrication of another exemplary magnetoresistive device;

FIG. 8 is a schematic diagram of an exemplary magnetoresistive memory element electrically connected in a magnetoresistive memory cell configuration;

FIG. 9A is a schematic block diagram illustrating an exemplary discrete memory device that includes an exemplary memory element of the current disclosure;

FIG. 9B is a schematic block diagram illustrating an exemplary embedded memory device that includes a memory element of the current disclosure; and FIG. 10 is a flow chart that illustrates an exemplary manufacturing flow for the formation of an exemplary magnetoresistive device, according to the present disclosure.

There are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, means the value, limit, and/or range ±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "region" is used generally to refer to one or more layers of material. That is, a region (as used herein) may include a single layer (or coating) of material or multiple layers or coatings of materials stacked one on top of another to form a multi-layer system. Further, although in the description below, the different regions in the disclosed stack/structure are sometimes referred to by specific names (capping layer, reference layer, transition layer, etc.), this is only for ease of description and not intended as a functional description of the layer.

As alluded to above, in one exemplary aspect, the magnetoresistive device of the present disclosure, formed from a magnetoresistive stack/structure, may be used in a magnetic tunnel junction type device (MTJ device). The MTJ device may be implemented, for example, as a spin-torque magnetoresistive random access memory ("MRAM") element ("memory element"), a magnetoresistive sensor, a magnetoresistive transducer, etc. In such aspects, the magnetoresistive stack/structure may include an intermediate layer positioned (or sandwiched) between two ferromagnetic regions/layers. The intermediate layer may be a tunnel barrier and may include an insulating material, such as, e.g., a dielectric material. In other embodiments, the intermediate layer may be a conductive material, e.g., copper, gold, or alloys thereof. In such embodiments, where the magnetoresistive stack/structure includes a conductive material in between two ferromagnetic regions/layers, the magnetoresistive stack/structure may form a GMR or GMR-type device.

For the sake of brevity, conventional manufacturing techniques related to semiconductor processing may not be described in detail herein. The exemplary embodiments may be fabricated using known manufacturing techniques and processes, including, but not limited, lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of a developer. An etch may then be employed/applied whereby the layer not protected by the remaining resist is patterned. Alternatively, an additive process can be used in which a structure is built up using the photoresist as a template.

As noted above, in one aspect, the described embodiments relate to, among other things, methods of manufacturing a magnetoresistive device, e.g., a magnetic tunnel junction bit (MTJ bit) or a magnetic tunnel junction type device (MTJ device), from a magnetoresistive stack/structure. The magnetoresistive stack/structure may include, or may be operably coupled to, one or more electrically conductive electrodes, vias, or conductors on either side of a magnetic material stack. As described in further detail below, the magnetic material stack may include many different layers of material, where some of the layers include magnetic materials, whereas others do not. In one embodiment, the methods of manufacturing may include sequentially depositing, growing, sputtering, evaporating, and/or providing (collectively referred herein as "depositing" or other verb tense (e.g., "deposit" or "deposited")) layers and regions which, after further processing (for example, etching) those layers form a magnetoresistive stack/structure.

The described magnetoresistive stacks/structures may be formed between a top electrode/via/line and a bottom electrode/via/line, both of which may permit access to the stack/structure by allowing for connectivity (for example, electrical) to circuitry and other elements of the magnetoresistive device. Between the electrodes/vias/lines are layers and/or regions, including at least one "fixed" magnetic region (which may include, among other things, a plurality of ferromagnetic layers), at least one "free" magnetic region (which may include, among other things, a plurality of ferromagnetic layers), and one or more intermediate layers or regions disposed between a "fixed" magnetic region and the "free" magnetic region. In some embodiments, the one or more intermediate layers or regions may be a dielectric layer or region. In other embodiments, however, the one or more intermediate layers or regions may be a conductive layer or region. In some embodiments, the top electrode (and/or the bottom electrode) may be eliminated, and the bit line may be formed on top of the magnetoresistive stack.

FIG. 1 illustrates a cross-sectional view of an exemplary magnetoresistive stack/structure 100 (for example, an in-plane or out-of-plane magnetic anisotropy magnetoresistive stack/structure (e.g., a perpendicular magnetic anisotropy magnetoresistive stack/structure)) having multiple regions (10, 20, 30, etc.) formed one on top of another. For the sake of brevity, in the discussion below, the magnetoresistive stack/structure 100 is referred to as a "magnetoresistive stack." It will be recognized that several other commonly-used regions (or layers) (e.g., various protective cap layers, seed layers, etc.) are not illustrated in FIG. 1 (and in subsequent figures) for clarity. Each of the regions (10, 20, 30, etc.) of magnetoresistive stack 100 may comprise one or more layers of material. That is, for example, in some embodiments, region 10 may comprise a single layer of a material (e.g., element, a chemical composition, alloy, composite, etc.) formed on (e.g., directly on) region 20, and region 20 may comprise multiple layers of materials (of the same or different materials) sequentially formed (one atop the other) on region 30. In the discussion below, the term "region" is intended to cover both a region or a zone comprising a single layer of material (e.g., region 10 in the example above) and a region or zone comprising multiple layers of material (e.g., region 20 in the example above).

As known to one skilled in the art, the interface between the multiple regions (10, 20, 30, etc.) (and/or the interface between the multiple layers, if any, within a region) may, in some cases, be characterized by compositional (e.g., chemical) and/or structural changes due to intermixing between the materials (or intermetallic formation) of the adjacent regions (e.g., during deposition, post deposition anneal, etc.). For example, while the compositional profile across an ideal interface (i.e., an interface which does not undergo compositional changes) between two regions (or layers) may indicate a sharp profile (i.e., the composition abruptly changes from the composition of one region to that of the other region), the compositional profile across a typical interface of magnetoresistive stack 100 of FIG. 1 may indicate a different profile. For example, the profile may indicate a gradual change in chemical composition across an interface of two regions if intermixing occurs between the materials of the regions, or the profile across the interface may indicate the presence of a different composition in the vicinity of the interface if a different interfacial phase (e.g., an intermetallic) is formed at the interface.

Magnetoresistive stack 100 of FIG. 1 may include intermediate regions 40 and 60 (such as, for example, a dielectric layer or a conductive layer) disposed between magnetic material regions 30 and 50, and/or magnetic material regions 50 and 70. In a fabricated magnetoresistive device (e.g., MRAM, etc.), the magnetic material regions 30, 70 may function as a "fixed" magnetic region, the magnetic material region 50 may function as a "free" magnetic region, and the intermediate regions 40, 60 may function as tunnel barriers. As illustrated in FIG. 1, for example, regions 30, 40, 50, 60, and 70 may be sequentially formed between electrically conductive regions 20 and 80. In the fabricated magnetoresistive device, regions 20 and 80 may function as electrodes. For example, region 20 may be a top electrode and region 80 may be a bottom electrode. However, those of ordinary skill in the art will recognize that the relative order of the various regions of magnetoresistive stack 100 may be reversed. That is, region 20 may function as the bottom electrode and region 80 may function as the top electrode.

Regions 20 and 80 may include any electrically conductive material, and may be part of (or be in physical contact with) electrically conductive interconnects (e.g., vias, traces, lines, etc.) of the magnetoresistive stack 100 (e.g., as shown in FIG. 8). Although any electrically conductive material may be used for regions 20, 80, in some embodiments, a metal such as tantalum (Ta), titanium (Ti), tungsten (W), or a composite or alloy of these elements (e.g., tantalum-nitride alloy) may be used. In some embodiments, one or both of regions 20 and 80 may be eliminated. For example, in some embodiments, region 20 may be eliminated by positioning the bit line (of the MRAM) on top of the stack, and region 80 may be eliminated by forming the stack on a conductive region of the die backend (metallization layer, redistribution layer, etc.).

As illustrated in FIG. 1, region 80 may be formed on a planar (or substantially planar) surface of a semiconductor substrate 90 (e.g., backend of an IC device, etc.), and regions 80, 70, 60, 50, 40, 30, 20, and 10 may each be formed on, or above, the underlying region or regions. Each region may be formed directly on the underlying region, or may be formed on an intermediate layer (seed layer, etc.) formed, or deposited, on a surface of the underlying region. For example, although not illustrated in FIG. 1, in some embodiments, the top surface of region 80 (i.e., the surface of region 80 on which region 70 is formed) may include a seed layer or region. The seed layer may be formed by converting a portion of the top surface of region 80 into the seed layer, or the seed layer may be deposited on the top surface of region 80. This seed region may facilitate the formation of region 70 thereon, and in some embodiments, may include one or more of nickel, chromium, cobalt, iron, and alloys thereof (for example, an alloy including nickel and/or chromium). In general, any suitable material deposition process (CVD, PVD, sputtering, plating, etc.) may be used to form an overlying region on the corresponding underlying region (e.g., region 70 on region 80, region 60 on region 70, etc.). Since such processes are well known in the art, they are not discussed herein.

As explained above, regions 30 and 70 may serve as a "fixed" magnetic region, and region 50 may serve as a "free" magnetic region of magnetoresistive stack 100. That is, a magnetic moment vector in a "fixed" region 30, 70 does not move significantly in response to applied magnetic fields (e.g., an external field) or applied currents used to switch the magnetic moment vector of "free" region 50, as explained above. Regions 30, 50, 70 are illustrated as a single layer in FIG. 1 only for the ease of illustration. As explained previously, in some embodiments, each of these regions (e.g., regions 30, 50, 70) may comprise several layers of a magnetic or a ferromagnetic material formed one on top of another. In addition, regions 30, 50, and 70 may also include additional layers, including, but not limited to, an antiferromagnetic coupling layer, a reference layer, and/or a transition layer.

In some embodiments, regions 30, 70 may include alloys that include cobalt and iron, and preferably, boron. In some embodiments, one or both of these layers may also include, for example, alloys or engineered materials with one or more of palladium, platinum, magnesium, manganese, and chromium. Additionally or alternatively, in some embodiments, one or both of the regions 30, 70 may comprise synthetic antiferromagnetic (SAF) or synthetic ferromagnetic (SyF) structures. Since SAFs and SyFs are known to those skilled in the art, additional description is omitted for the sake of brevity. In some embodiments, one or both of the regions 30, 70 may include one or more non-magnetic material layers. For example, ruthenium, copper, aluminum, tantalum, titanium, niobium, vanadium, zirconium, iridium, one or more alloys of these elements, and in certain embodiments, tungsten and molybdenum. In some embodiments, one or both of the regions 30, 70 may include a multi-layer structure of cobalt and platinum or cobalt and nickel (with or without other alloying elements). For example, in embodiments where regions 30 and/or 70 comprises a multi-layer structure of cobalt and platinum, the regions 30 and/or 70 may include a cobalt layer followed by a platinum layer formed on or above a surface of the cobalt layer. In general, regions 30, 70 may have any thickness (e.g., between approximately 8-300 Å).

Region 50 (which, as explained above, may function as the "free" magnetic region of the magnetoresistive stack 100) may be constructed such that a magnetic vector (or moment) in this region may be moved or switched by applied magnetic fields or currents (e.g., a spin-torque current). As with conventional magnetoresistive stacks/structures, the direction of the magnetization (i.e., the magnetic vector/moment) in region 50 determines the resistance of magnetoresistive stack 100. Similar to regions 30 and 70, region 50 may also comprise one or more ferromagnetic layers. Region 50 may include alloys of one or more of ferromagnetic elements, such as, nickel, iron, and cobalt. In some embodiments, one or more these layers also may also include boron. In some embodiments, additional elements may be added to the alloys to provide improved magnetic, electrical, or microstructural properties.

In some embodiments, region 50 may comprise multiple ferromagnetic layers separated by one or more intermediate layer(s) between the ferromagnetic layers. The ferromagnetic layers may include alloys of Co, Fe, and B, and the intermediate layer(s) may include a nonmagnetic material (e.g., tantalum, tungsten, molybdenum, ruthenium, rhodium, rhenium, iridium, chromium, osmium, vanadium, zirconium, titanium, niobium, molybdenum, hafnium, manganese, and their combinations) that provides coupling (e.g., ferromagnetic or antiferromagnetic coupling) between two adjacent ferromagnetic layers. In some embodiments, the thickness and/or the configuration of the intermediate layer(s) may be selected such that it does not form a continuous layer separating (and thus breaking direct electron exchange between) the adjacent ferromagnetic layers. Instead, the intermediate layer(s) may form a non-continuous layer (e.g., areas or patches of material) between the adjacent ferromagnetic layers. In some embodiments, the material of an intermediate layer may mix with the materials of the adjacent ferromagnetic layers to form a continuous region 50 (e.g., having a chemical composition that varies across the thickness of the region) so that adjacent ferromagnetic layers are directly exchange coupled to each other. In general, region 50 may have any thickness (e.g., between approximately 7-40 Å), and the thickness of the intermediate layer (if any) may typically be less than approximately 3.5 Å.

One or more layers of region 50 also may include alloys or engineered materials with one or more of, for example, palladium, platinum, magnesium, manganese, and chromium. In some embodiments, similar to regions 30 and 70, region 50 also may include one or more SAF or SyF structures, and one or more layers of non-magnetic materials, such as, for example, ruthenium, copper, aluminum, tantalum, titanium, niobium, vanadium, zirconium, iridium, tungsten, molybdenum, and alloys thereof. In some embodiments, one or more layers of the region 50 also may include ordered L10 alloys (such as, for example, Iron-Platinum (FePt), Iron-Palladium (FePd), Cobalt-Platinum (CoPt), or Iron-Nickel-Platinum (FeNiPt)), artificial multi-layered structures (such as, Cobalt/Platinum (Co/Pt), Cobalt/Palladium (Co/Pd), Cobalt-Chromium/Platinum (CoCr/Pt), Cobalt/Gold (Co/Au), or Nickel/Cobalt (Ni/Co)), and alloys of Cobalt-Iron-Boron (CoFeB). These materials may provide a strong perpendicular magnetic anisotropy (PMA) to region 50 and may improve the performance of magnetoresistive stack 100. As explained previously, any suitable deposition process may be used to form regions 30, 50, 70. In some embodiments, some or all of these regions (or one or more layers that make up these regions) may be deposited using a "heavy" inert gas (for example, xenon, argon, krypton, etc.), for example, at room temperature (for example, 15-40° C., and more preferably 20-30° C., and most preferably 25° C. (+/−10%)) or at a conventional/typical elevated temperature.

With continued reference to FIG. 1, an intermediate region 60 may be positioned between regions 70 and 50, and an intermediate region 40 may be positioned between regions 50 and 30. In some embodiments, the intermediate regions 40, 60 may include a dielectric material, and may function as a tunnel barrier in the magnetoresistive stack 100. However, it is also contemplated that, one or both of the intermediate regions 40, 60 may include a conductive material (e.g., copper) to form a GMR-type magnetoresistive stack/structure. In general, intermediate regions 40, 60 may be formed using any technique now known (e.g., deposition, sputtering, evaporation, etc.) or later developed. In some embodiments, one or both of intermediate regions 40, 60 may include an oxide material, such as, for example, Magnesium Oxide (MgO) or Aluminum Oxide ($AlO_x$)(e.g., $Al_2O_3$), and may be formed by multiple steps of material deposition and oxidation. In general, the intermediate regions 40, 60 may have any thickness (e.g., between approximately 8.5-14.1 Å).

Although not illustrated in FIG. 1, in some embodiments, region 70 (and/or region 50) may include one or more interfacial regions (e.g., a transition layer, a reference layer, etc.) disposed at its interface with intermediate region 60 (and/or region 40, respectively). These interfacial regions may include one or more layers of material that, among other things, facilitate/improve growth of the intermediate region 60 (and/or 40) during fabrication. In one embodiment, the interfacial region between regions 70 and 60 (and/or regions 50 and 40) may include one or more layers of an amorphous alloy (e.g., CoFeB or CoFeBTa or CoFeTa) and one or more layers of a non-ferromagnetic transition metal (e.g., tantalum, titanium, tungsten, ruthenium, niobium, zirconium, and/or molybdenum). In some embodiments, during processing, a layer of iron (for example, deposited as pure or substantially pure iron) and a layer of cobalt, iron, and boron (for example, deposited as an alloy) may be deposited on the top surface (with reference to FIG. 1) of region 70. After further/final processing (e.g., after annealing), the layer of iron at the interface between regions 70 and 60 may form a continuous atomic layer, or may mix with the underlying ferromagnetic alloy of region 70 in the final annealed structure, resulting in a high-iron concentration in region 70 at its interface with region 60.

With continued reference to FIG. 1, region 20 may be provided (deposited, grown, sputtered, etc.) on or above region 30, and region 10 may be provided on or above region 20. As explained previously, region 20 may be formed of a material, such as, for example, tantalum, titanium, tungsten, or a composite or alloy of these elements (e.g., tantalum-nitride alloy), and in some embodiments, region 20 may be eliminated altogether. Region 10, in some embodiments, may serve as a hard mask to assist in the subsequent processing (etching, patterning, etc.) of the magnetoresistive stack 100. That is, region 10 may protect the underlying regions from reactive compounds and gases used in the subsequent processing (e.g., etching) of magnetoresistive stack 100. Region 10 may be formed or deposited using any now known or later developed technique. In some embodiments, region 10 may include silicon oxide, silicon nitride, and/or another material that is relatively inert to the reactants used during subsequent processing.

In some embodiments, region 10 may include one or more metals (e.g., region 10 may be a metal hard mask). Suitable metals for region 10 may include, for example, noble metals and/or alloys thereof, for example, alloys of a noble metal with transition metals (for example, Platinum (Pt), Iridium (Ir), Molybdenum (Mo), Tungsten (W), Ruthenium (Ru), and/or an alloy of AB (where A=Pt, Ir, Mo, W, Ru and B=Fe, Ni, Manganese (Mn)). In some embodiments, region 10 may be comprised of materials such as, Titanium-Nitride (TiN), Platinum Manganese (PtMn), or Iridium-Manganese (IrMn). In some embodiments, region 10 may include multiple layers of material formed one atop another. For example, in some embodiments, region 10 may include TiN over PtMn and/or IrMn. In some embodiments, region 10 may be formed by a material harder than an ultralow K dielectric material used in the magnetoresistive stack 100. In general, region 10 may have any thickness. In some embodiments, the thickness of region 10 may be in the range of approximately 5-200 Å. In some embodiments, region 10 may be, for example, approximately 15-150 Å thick, or preferably approximately 20-100 Å thick.

When implemented in an MTJ-like memory device, magnetoresistive stack 100 of FIG. 1 may be referred to as having a dual spin filter (DSF) structure with a first MTJ comprising regions 70, 60, and 50, and a second MTJ comprising regions 30, 40, and 50. In some embodiments of the present disclosure, a magnetoresistive stack may only include a single MTJ. FIG. 2 illustrates an exemplary magnetoresistive stack 200 having a single MTJ comprising regions 70, 60, and 50. The regions of magnetoresistive stack 200 which are similar to the regions of the MTJ formed by magnetoresistive stack/structure 100 (of FIG. 1) are numbered similarly, and not described again for the sake of brevity. As illustrated in FIG. 2, in some embodiments, a interfacial region 45 may be provided at the interface between regions 50 (which, as explained above with reference to FIG. 1, may serve as the "free" region) and region 20 (which may be an electrode of MTJ 200). Region 45 may serve as a capping region, and may comprise one or more layers of a dielectric material (e.g., MgO, $Al_2O_3$, etc.). In some embodiments, the interfacial region 45 may have a thickness between approximately 3-14 Å. Although not illustrated in FIG. 2, some embodiments of the described magnetoresistive stacks may additionally include a discontinuous layer of an insertion material at the interface between region 50 and the interfacial region 45. This insertion material may be a dusting (e.g., non-continuous patches or areas) of any non-ferromagnetic transition metal element (e.g., Ir, Cr, etc.) having a thickness of less than one atomic layer of the material selected. The insertion material may increase the PMA of the resulting magnetoresistive stack 200. Although the interfacial region 45 of FIG. 2 and the insertion material are not illustrated in FIG. 1, in some embodiments, magnetoresistive stack 100 of FIG. 1 may also include a similar interfacial region and an insertion material.

The exemplary stacks/structures 100, 200 of FIGS. 1 and 2, and the method of fabricating these stacks/structure are described herein as illustrative examples. Many other stacks or structures are possible. Some other exemplary magnetoresistive stacks and fabrication methods are described in U.S. Pat. Nos. 8,686,484; 8,747,680; 9,136,464; and 9,419,208, each assigned to the assignee of the current application and incorporated by reference in its entirety herein. Each of these stacks/structures may be used in connection with the current disclosure. Further, as explained previously, although a magnetoresistive stack/structure is used to describe aspects of the current disclosure, the disclosure is not limited thereto. Instead, the current disclosure may be applied in the fabrication of any integrated circuit device structure.

After the multi-layer magnetoresistive stack 100 of FIG. 1 (or magnetoresistive stack 200 of FIG. 2) is formed, the multi-layer structure may be etched to form one or more magnetoresistive devices in a desired pattern. The magnetoresistive device may include, but are not limited to, magnetic tunnel junction bits, such as, e.g., MTJ bits 120. These MTJ bits 120 may be further processed to form the desired magnetoresistive device, such as, e.g., an MTJ device. FIG. 3 illustrates the magnetoresistive stack 100 of FIG. 1 etched in an exemplary pattern to form multiple MTJ bits 120 at a desired pitch by etching etched-regions 110 between the bits 120. Though the MTJ bits 120 and/or etched-regions 110 depicted in FIG. 3 appear to have substantially uniform vertical sidewalls, those of ordinary skill in the art that the sidewalls may include one or more irregularities. Any known (or later developed) etching process may be used to etch through the different regions of the magnetoresistive stack 100 (of FIG. 1) to form the MTJ bits 120 of FIG. 3. In some embodiments, after deposition of region 10 (e.g., the hard mask layer), a photo resist may be deposited thereon, and patterned to predetermined dimensions consistent with, or correlated to, the desired dimensions of the MTJ bits 120 (of FIG. 3). The photo resist may be deposited and patterned using any now known or later developed technique (e.g., well known conventional deposition and lithographic techniques). Region 10 (e.g., the hard mask layer) may then be etched using a suitable etching technique (e.g., for example, physical etching, such as, sputter etching, ion beam etching or milling, reactive ion beam etching or milling, etc.) to transfer the photo resist pattern to region 10 (e.g., remove region 10 from areas above the etched-regions 110). Although not required, in some embodiments, the photo resist may be removed or stripped from the magnetoresistive stack 100 (e.g., from above region 10 using conventional techniques) after region 10 is patterned and/or before subsequent processing of magnetoresistive stack 100.

The multiple regions of the magnetoresistive stack 100 may then be etched with region 10 "protecting" or masking the areas covered by remaining portions of region 10, to form, define, pattern and/or provide the MTJ bits 120 separated by etched-regions 110 (see FIG. 3). The multiple regions (20, 30, 40, 50, 60, 70, 80) of the magnetoresistive stack 100 may be etched by any suitable process now known or developed in the future (e.g., physical etching, etc.). In some embodiments, an ion beam (comprising Argon, Krypton, Xenon, etc.) may be used to sputter etch through the multiple regions of the magnetoresistive stack 100 and form the etched-regions 110. In some embodiments, reactive ion beam etching (ion beam of a reactive species) may be used for form the etched-regions 110. During ion beam etching, as known to those of ordinary skill in the art, the magnetoresistive stack 100, with selected areas covered by patterned region 10, may be placed in a vacuum chamber, and exposed to an ion beam (a reactive ion beam, in some embodiments). The ion beam may be substantially normal (or perpendicular) to a surface of the magnetoresistive stack 100 that is being etched or may make a small angle with respect to an axis normal to the surface. For example, with reference to FIG. 3, in some embodiments, the ion beam used to etch the etched-regions 110 may make an angle θ between about 0 and less than about 30° ($0°≤θ<30°$) or between about 0-20° ($0°≤θ≤20°$) with respect to a normal axis 105 of magnetoresistive stack 100. To distinguish the etching process used to etch etched-regions 110 from an "angled etch" process described below, the etching process used to etch etched-regions 110 may be referred to as straight etching or as a "straight etch" process. As known to a person of ordinary skill in the art, during ion beam etching, the impact of the ions ablates the areas of the stack not covered by region 10. In some embodiments, region 10 may not be patterned prior to etching the regions underlying region 10. Instead, a mask (e.g., a photoresist mask) may be used to selectively etch through the multiple regions of the stack including region 10.

During the etching process, a portion of the ablated material may be redeposited on the side walls of the MTJ bits 120 (e.g., as a veil) to form a redeposited layer 130. The redeposited layer 130 may include nonvolatile byproducts of the multiple regions (20, 30, 40, 50, 60, 70, 80) that are removed (or ablated) by the etching process. The redeposited layer 130 may include both magnetic and non-magnetic materials from the different regions. Due to the ferromagnetic and other electrically conductive materials in some of the removed regions (e.g., regions 20, 30, 50, 70, 80, etc.), the redeposited layer 130 may be electrically conductive and/or magnetically active. The redeposited layer 130, may in some cases, also detrimentally affect the resistance and magnetic property distribution within an array of MTJ bits 120. To prevent electrical shorting between the multiple regions along the thickness of MTJ bit 120 (e.g., regions 80 and 20, 30 and 70, etc.), and to preserve the magnetic property distribution in the MTJ bit array, in some embodiments, the side walls of the bits may be etched (or otherwise cleaned) to remove at least a portion of the redeposited layer 130 after etching the etched-regions 110 or portions thereof. The side walls of an MTJ bit 120 may be etched (or otherwise cleaned) by any suitable now-known or future-developed process.

Figure 4A:
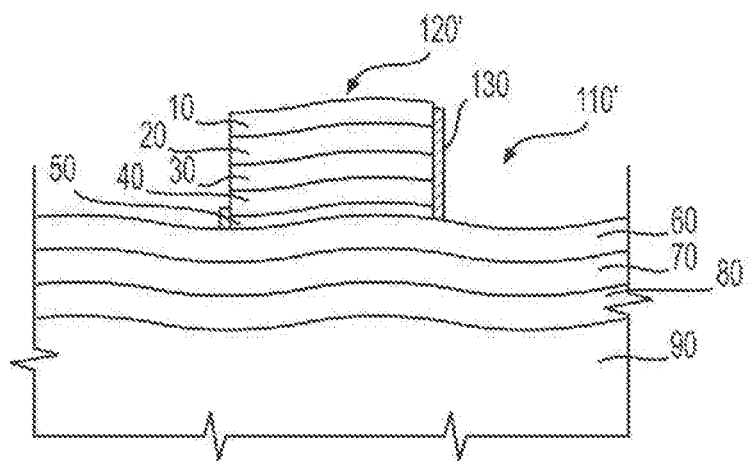
Figure 4B:
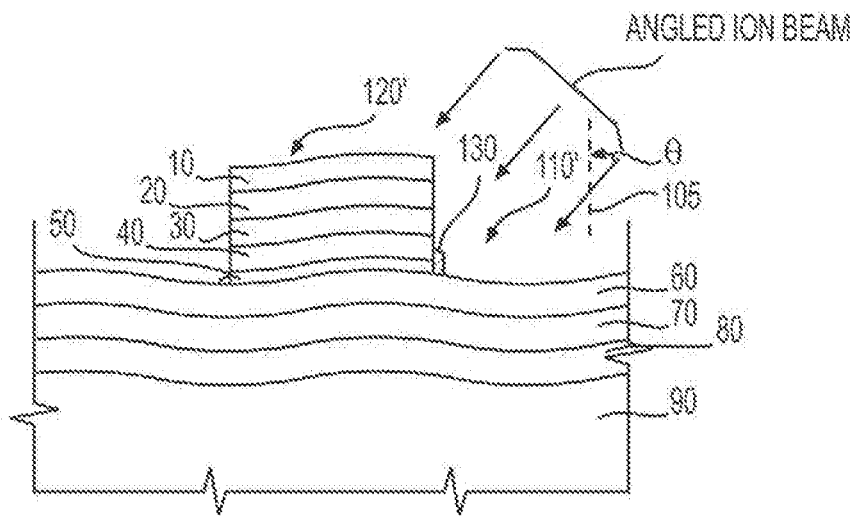

In some embodiments, an angled etch process, (e.g., an etch process utilizing angled ion beam relative to the wafer or the wafer may be tilted with respect to the ion beam) is directed into the etched-region 110 (e.g., as shown in FIG. 4B) to etch away the redeposited layer 130 from the side walls of the MTJ bits 120. In general, as illustrated in FIG. 4B, during the angled etch process, the ion beam may be tilted more with respect to normal axis 105 than during straight etching. That is, angle θ during angled etching may be greater than the angle θ during straight etching. For example, in some embodiments, during the angled etch process, the ion beam may be tilted at any angle θ between about 30° and less than about 90° with respect to normal axis 105 or ($30°≤θ<90°$). In some embodiments, during the angled etching, θ may be greater than or equal to about 30° and less than or equal to about 60° ($30°≤θ≤60°$), or $30°≤θ≤70°$. It should be noted that although the ion beam is described as being tilted with respect to normal axis 105 in the description above, this is only exemplary. In some embodiments, during angled etching, instead of (or in addition to) tilting the ion beam, the wafer with the magnetoresistive stack 100 may be tilted. With increasing height and/or decreasing pitch of the MTJ bits 120, it may be hard to remove portions of the redeposited layer 130 towards the bottom of the etched-region 110 using such aforementioned angled etch processes (or other similar processes). In some cases, the resulting remaining redeposited layer 130 on the side walls may have the potential to cause electrical shorts (and/or other variations in the magnetic property distribution) of MTJ bits 120. Therefore, in some embodiments, the process of etching the etched-regions 110 to form the MTJ bits 120 may be modified according to the principles described.

In some embodiments, after forming the magnetoresistive stack 100 (see FIG. 1), a plurality of the regions, but less than all of the regions, of the magnetoresistive stack 100 may be etched to form a partially etched MTJ bit or a partial MTJ bit 120'. FIG. 4A illustrates an exemplary partial MTJ bit 120' formed by terminating the etching process at an interface of region 60 (which, as previously explained, may be a dielectric material that functions as a tunnel barrier in a completed MTJ device) or within region 60. The partial MTJ bit 120' may be formed by any etching process. In some embodiments, the partial MTJ bit 120' may be formed by an ion beam etch process as described above with reference to MTJ bit 120 of FIG. 3 (e.g., a straight etch process). Any known process may be used to terminate the etch process at region 60. In some embodiments, the etch process (i.e., the process used to partially etch the magnetoresistive 100 and form a partial etched-region 110') may be time and/or endpoint controlled or monitored. In one embodiment, the etch process may be stopped when endpoint monitoring detects the presence or absence of a predetermined material (or a combination of materials) at the bottom of the etched-region. That is, in the etch process used to etch the partial etched-region 110' of FIG. 4A, the etch process may be terminated upon detecting the material (e.g., a dielectric material) of region 60 to stop the etch at the beginning of region 60. The presence of region 60 may be detected during etching by any suitable mechanism. In some embodiments, the material of region 60 may be detected based on optical emission spectra (OES). That is, the etch process may be terminated when a rise in OES signal for the material of region 60 is detected. Here, the etch process terminates at the beginning of region 60 before significant etching of region 60 occurs. In some embodiments, however, the etch process may be terminated when a significant drop in OES signal of the material of region 50 (i.e., the region above region 60) is detected. Here, the etch process terminates immediately above region 60 after substantially all of region 50 is etched. In some embodiments, the etch process may be continued for limited duration after etching of region 60 begins so as to terminate the etching process within region 60. Those of ordinary skill in the art will readily recognize that the process of forming etched-regions 110' may be terminated at or within any region 10, 20, 30, 40, 50, 60, 70, or 80 of magnetoresistive stack 100. For example, the process of forming etched-regions 110' may be terminated at or within intermediate layer 40.

As described with reference to FIG. 3, as a result of the etching process, a portion of the etched material may be redeposited on the side walls of the partial MTJ bits 120' to form a redeposited layer 130' (see, e.g., FIG. 4A). The height of the redeposited layer 130 may be substantially uniform around the bits (as illustrated in FIG. 3) or may be different (as illustrated in FIG. 4A). The variability in the height of the redeposited layer 130 (around a bit and between different bits) may result from a variability in the spacing between the bits or variability in the underlying structure. In some embodiments, as illustrated in FIG. 4B, the redeposited layer 130' may be at least partially removed by a suitable process, such as, for example, angled ion beam etching, as described above. Due to the reduced depth of the partial etched-region 110' (as compared to etched-region 110 of FIG. 3), a greater depth of the redeposited layer 130 can be removed from the side wall of the partial MTJ bit 120' than from the side wall of the MTJ bit 120 of FIG. 3. In some embodiments, substantially all of the redeposited layer 130 may be removed from the side wall of the partial MTJ bit 120' by an angled ion beam etch. However, in some embodiments, as illustrated in FIG. 4B, a relatively small height of the redeposited layer 130 may remain on the side wall of MTJ bit 120'. In some embodiments, the step of etching or otherwise "cleaning" of the side walls of MTJ bit 120' may be eliminated altogether. That is, all of the redeposited layer 130 formed during the formation of the partial MTJ bit 120' may remain on its side walls.

In some embodiments, in addition to removing a portion of the redeposited layer 130 or instead of removing any of the redeposited layer, the redeposited layer 130 on the side wall of the partial MTJ bit 120' may be subjected to a chemical process to render the redeposited layer 130 electrically nonconductive (e.g., to passivate the redeposited layer 130). The partial MTJ bit 120' may be subjected to any known chemical process (e.g., oxidation, nitridization, etc.) to render the redeposited layer 130 nonconductive. In some embodiments, after etching partial etched-regions 110' using straight etching to form partial MTJ bits 120' with redeposited layers 130 on their side walls, the partial MTJ bits 120' may be plasma oxidized (or passivated) by exposing the partial MTJ bits 120' to an active oxygen plasma to oxidize the redeposited layers 130 and render them electrically nonconductive. In some embodiments, an angled etch process may be carried out to remove at least a portion of the redeposited layers 130 on the side walls of the partial MTJ bits 120' before subjecting the cleaned partial MTJ bits 120' to an oxygen plasma (or another chemical process) to render any remaining redeposited layers 130 on the side walls nonconductive. In some embodiments, one of the angled etch process to remove the redeposited layer 130 or the chemical process to make the redeposited layer 130 nonconductive may be eliminated.

Figure 4C:
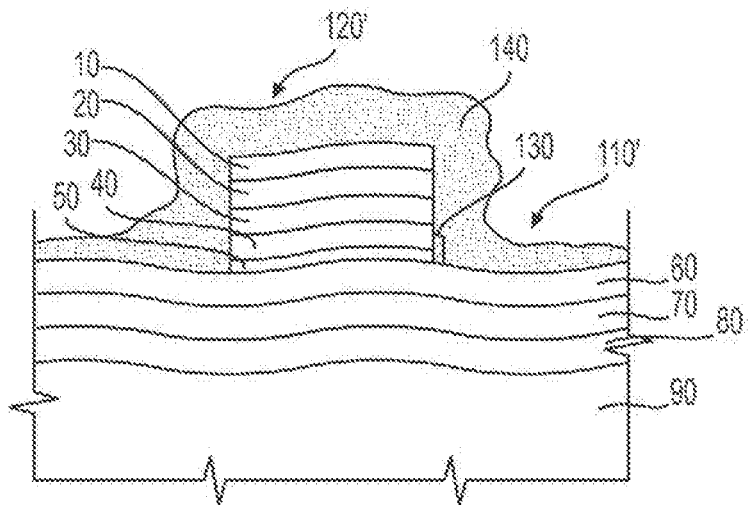

With reference now to FIG. 4C, in some embodiments, a first encapsulant 140 may be deposited on the partially formed MTJ bit 120', including its side walls, and within etched-regions 110'. First encapsulant 140 may partially, substantially, or completely fill etched-regions 110'. In some embodiments, a layer of first encapsulant 140 may be deposited on all, or substantially all, of the exposed portions of the partially formed stack/structure. Any suitable process (e.g., CVD, ALD, etc.) may be used to deposit the first encapsulant 140. The first encapsulant 140 may, in general, include any electrically non-conductive material. In some embodiments, silicon nitride (e.g., $Si_3N_4$, SiN, etc.) or silicon oxide (e.g., $SiO_2$, $SiO_x$, etc.) may be used as the first encapsulant 140. However, other materials such as, for example, aluminum oxide (such as $Al_2O_3$), magnesium oxide (such as MgO), a tetraethoxysilane (TEOS), and/or one or more combinations thereof, may also be used as the first encapsulant 140. In some embodiments, the first encapsulant 140 may be initially deposited as a conductor (for example, a metal such as aluminum or magnesium), and thereafter oxidized or nitridized to change or transform at least a portion of the material to an insulative material. In general, the first encapsulant 140 may have any thickness. In some embodiments, the thickness of the first encapsulant may be between about 10-500 Å, preferably between about 50-300 Å, and more preferably between about 100-300 Å.

Figure 4D:
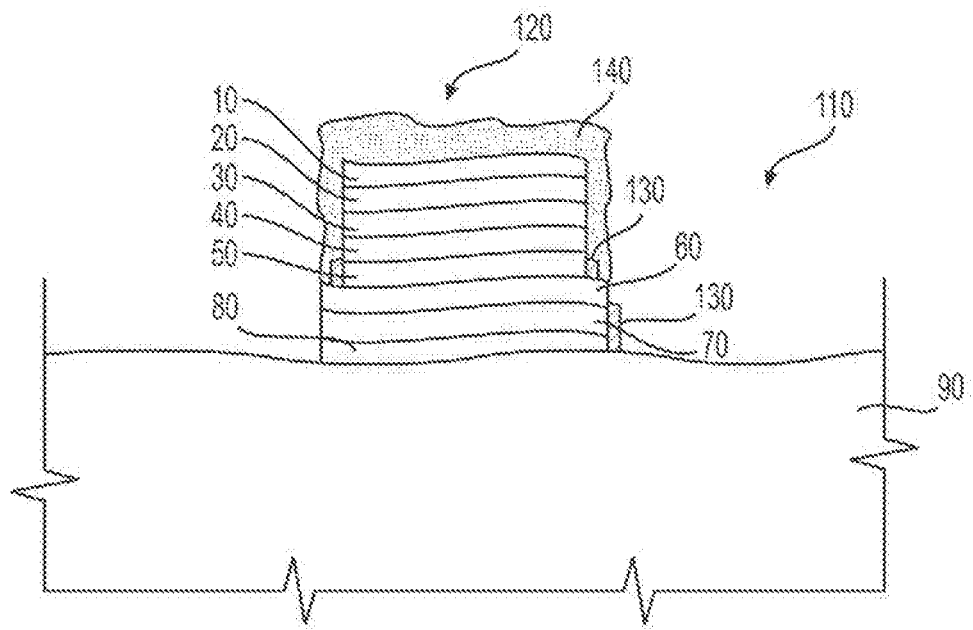

The first encapsulant 140 coating on the partial MTJ bit 120' may then be used as a spacer or a mask to etch the remainder of the stack at the base of the partial etched-region 110'. In some embodiments, the remainder of the stack may be etched without additional photoresist patterning (i.e., by only using the deposited first encapsulant 140 as a mask or guide). FIG. 4D is a cross-sectional schematic illustration of magnetoresistive stack 100 after the remainder of the regions (e.g., regions 60, 70, and 80) of the stack at the base of the partial etched-region 110' (see FIG. 4C) have been etched to form multiple complete MTJ bits 120 (only one shown in FIG. 4D) separated by etched-regions 110. Any suitable etch process (e.g., straight etching) may be used for the etching. In some embodiments, a physical etching process (e.g., ion beam etching, reactive ion beam etching, etc.), similar to that used to create the partial etched-region 110' (of FIG. 4A) may be used as the etch process. During the etching, the first encapsulant 140, deposited on the base of the partial etched-region 110' (see FIG. 4C) may be first ablated and removed before the underlying regions (e.g., regions 60, 70, and 80) at the base of the partial etched-region 110' are removed. At the end of this subsequent etching process, some (in some cases, substantially all) of the first encapsulant 140 covering the side walls and the top of the partial MTJ bit 120' may also be removed. However, the first encapsulant 140 covering the partial MTJ bit 120' during the etching may prevent significant ablation of the underlying regions of the partial MTJ bit 120'. In some embodiments, the first encapsulant 140 at the base of the partial etched-region 110' may be removed in an optional etching or cleaning step prior to etching the regions (e.g., regions 60, 70, and 80) of the stack 100 at the base of the partial etched-region 110' (i.e., prior to etching step of FIG. 4D). Any suitable process, such as physical etching, may be used to selectively etch the first encapsulant 140 at the base of the partial etched-region 110'. In some embodiments, this optional etching or cleaning step may be eliminated. In some embodiments, the step of depositing the first encapsulant 140 on the partially formed MTJ bit 120' may be eliminated, and the remainder of the stack at the base of the partial etched-region 110' may be etched without covering the partial MTJ bit 120' with first encapsulant 140. For example, in some embodiments where the redeposited layer 130 on the side walls of the partial MTJ bits 120' are oxidized or passivated, the first encapsulant 140 may be eliminated since the redeposited layer 130 is electrically nonconductive.

As illustrated in FIG. 4D, a portion of the etched material (from the regions of the stack at the base of the partial etched-region 110') may be redeposited on the side walls of the etched-region to form a second redeposited layer 130'. However, because of the lower number of regions etched (e.g., regions 60, 70, and 80), any such redeposition may not be tall or large enough to cause electrical shorting issues, or to change the magnetic behavior of MTJ bit 120. Further, the first encapsulant 140 layer may be configured to electrically isolate the two redeposited layers 130 and 130', thereby reducing the likelihood of electrical shorting amongst the various regions or layers of MTJ bit 120. In embodiments where a first encapsulant 140 is not used (e.g., to cover the partially formed MTJ bit 120'), passivating any remaining redeposited layers 130 on the side walls of the partial MTJ bits 120' may assist in electrically isolating the two redeposited layers 130 and 130'. In some embodiments, some or all of the second redeposited layer 130' may be removed using any suitable process, including, but not limited to, the angled etch processes described above. In some embodiments, the second redeposited layer 130' may not be removed, and may remain on the side walls of the etched-region. In some embodiments, as an alternative to or in addition to removing the second redeposited layer 130', the MTJ bit 120 may be subjected to a chemical process to passivate or render the redeposited layer 130' electrically nonconductive. Although FIG. 4D depicts that second redeposited layer 130' may extend only partially along the height of MTJ bit 120, those of ordinary skill in the art will understand that second redeposited layer 130' may extend substantially along the height of MTJ bit 120, including, e.g., over first encapsulant 140.

Figure 4E:
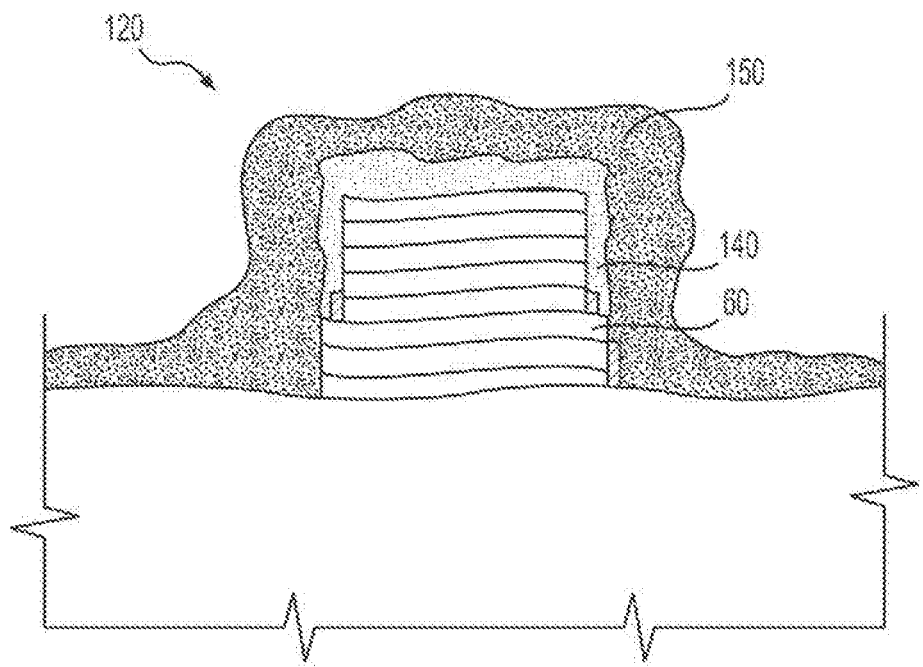

Turning now to FIG. 4E, a second encapsulant 150 may then be deposited on the MTJ bit 120 to form a conformal coating over the exposed regions of the bit 120 (including the side walls) and the first encapsulant 140. The second encapsulant 150 may include any electrically conductive material. In some embodiments, the second encapsulant 150 may include any material previously described with respect to the first encapsulant 140. In some embodiments, similar to the first encapsulant, the second encapsulant may also be deposited as a conductive material that may then be converted (i.e., oxidized, nitridized, etc.) to an insulative material. In some embodiments, both the first encapsulant 140 and the second encapsulant 150 may include the same material. In general, the second encapsulant 150 may have any thickness. In some embodiments, the thickness of the second encapsulant 150 may be between about 10-500 Å, preferably between about 50-300 Å, and more preferably between about 100-300 Å. In some embodiments, the second encapsulant 150 may be deposited so as to only partially fill etched-regions 110, as depicted in FIG. 4D. In other embodiments, second encapsulant 150 may completely or substantially completely fill etched-regions 110 in between the multiple MTJ bits 120.

After the MTJ bits 120 are formed as described above, additional processing steps (such as, for example, polishing a top surface of the structure to expose a conductive region of the MTJ bits 120, and forming a bit contact structure on the exposed regions of the MTJ bits 120 to make electrical contact with these MTJ bits 120, etc.) may be performed to fabricate an MTJ device from the MTJ bits 120. Since these additional processing steps are known to those of ordinary skill in the art, they are not described herein for the sake of brevity.

It should be noted that, although an embodiment with a single cleaning step (e.g., angled etching) is described above, this is only exemplary. In some embodiments, the method of forming MTJ bits 120 may include multiple etching and cleaning steps. For example, the method may include multiple alternate straight and angled etching steps to progressively etch away the regions (e.g., regions 10, 20, 30, 40, etc.) of magnetoresistive stack 100 and clean the redeposited material formed in the process. In some embodiments, a straight etch process may be carried out for a fixed time (e.g., 10 seconds, 20 seconds, 30 seconds, etc.) followed by an angled etch process for the same or a different fixed time. In some embodiments, the etching may be stopped based on the appearance or disappearance of some species in the plasma (e.g., in an OES signal). In some embodiments, the method may include multiple alternate straight etching and chemical processing (e.g., plasma oxidation) steps to progressively etch away regions (10, 20, 30, 40, etc.) of magnetoresistive stack 100 and passivate any redeposited material formed on the side walls of the partial MTJ bit in the previous etching step. In some embodiments, after forming a partial MTJ bit by etching some regions and cleaning and/or passivating the redeposited layer formed in the process, an encapsulant (e.g., first encapsulant 140) may be deposited over the cleaned partial MTJ bit before etching additional regions of the stack 100.

It should be noted that, although the method of forming MTJ bits 120 are described with reference to magnetoresistive stack 100 of FIG. 1, a similar process may also be used to form magnetoresistive bits from other exemplary magnetoresistive stacks (such as, for example, magnetoresistive stack 200 of FIG. 2, the magnetoresistive stacks disclosed in U.S. Pat. Nos. 8,686,484; 8,747,680; 9,023,216; 9,136,464; and 9,419,208, the disclosures of which are incorporated by reference herein).

FIGS. 5A-5E illustrate an exemplary process of forming magnetoresistive devices, such as, e.g., MTJ bits 220, from the magnetoresistive stack 200 of FIG. 2. Since manufacturing operations (etching, deposition, etc.) similar to those discussed above (i.e., with reference to the fabrication of MTJ bits 120 from magnetoresistive stack 100) may be used to fabricate MTJ bits 220, these manufacturing operations are not extensively described again below.

Figure 5A:
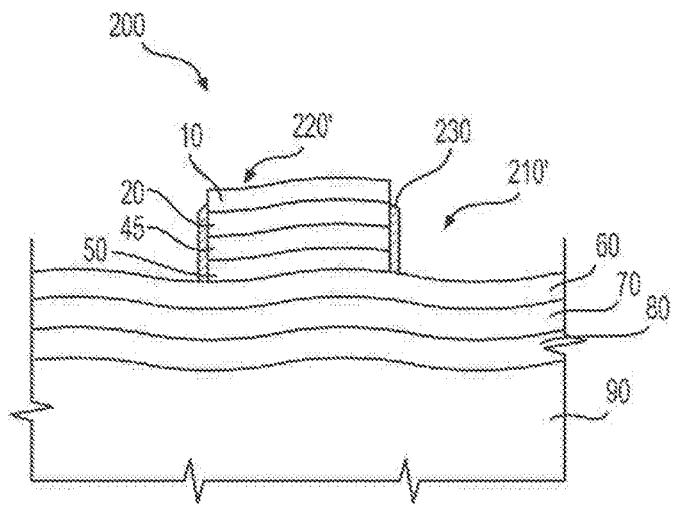
Figure 5B:
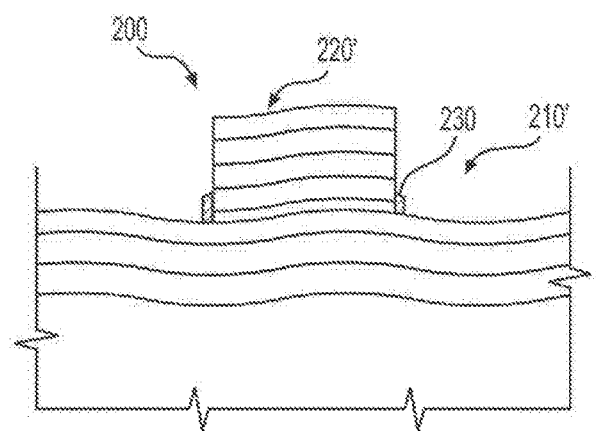

After forming magnetoresistive stack 200 of FIG. 2, multiple regions (e.g., regions 10, 20, 45, and 50) of magnetoresistive stack 200 may be etched to form a plurality of partial MTJ bits 220' (only one shown in FIG. 5A) separated by partially etched-regions 210'. Although in general, the etch process may be stopped at or within any region of magnetoresistive stack 200, in some embodiments as illustrated in FIG. 5A, the etch process may be terminated at the beginning of region 60 (e.g., before significant etching of region 60 occurs). As described with reference to FIG. 4A above, the etch process may be terminated at region 60 when, e.g., OES monitoring begins to detect signals corresponding to the material of region 60. As a result of the etching process, a portion of the etched material may be redeposited on the side walls of the partial MTJ bit 220' as a redeposited layer 230. In some embodiments, as illustrated in FIG. 5B, the redeposited layer 230 may be at least partially removed by angled ion beam etch or another suitable process. In some embodiments, this redeposited layer removal step may be eliminated, and the redeposited layer 230 may be left on the side walls. In some embodiments, any remaining redeposited layer 230 on the side walls of the partial MTJ bit 220' may be rendered electrically nonconductive by subjecting the partial MTJ bit 220' to a suitable chemical process (such as, for example, oxidation, nitridization, etc.).

Figure 5C:
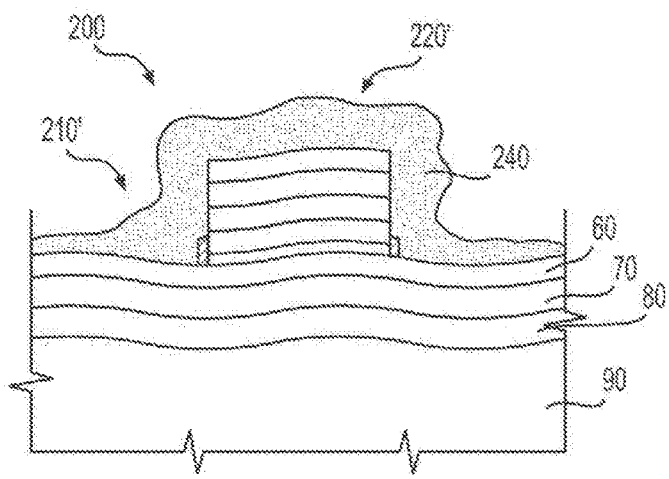

Turning now to FIG. 5C, a first encapsulant 240 may then be deposited to coat the partially formed MTJ bit 220', including the side walls of MTJ bit 220'. The first encapsulant 240 may be similar in material composition and thickness to the previously described first encapsulant 140. The layer of first encapsulant 240 on the partial MTJ bit 220' may then be used as a spacer to etch the remainder of magnetoresistive stack 200 (e.g., regions 60, 70, and 80) at the base of the partial etched-region 210'. As explained with reference to FIG. 4D above, in some embodiments, the remainder of magnetoresistive stack 200 may be etched without additional photoresist patterning (e.g., by only using the deposited first encapsulant 240 as a mask). In some embodiments, first encapsulant 240 may not be deposited and the remainder of magnetoresistive stack 200 may be etched without using first encapsulant 240 as a mask (e.g., by using a photoresist).

Figure 5D:
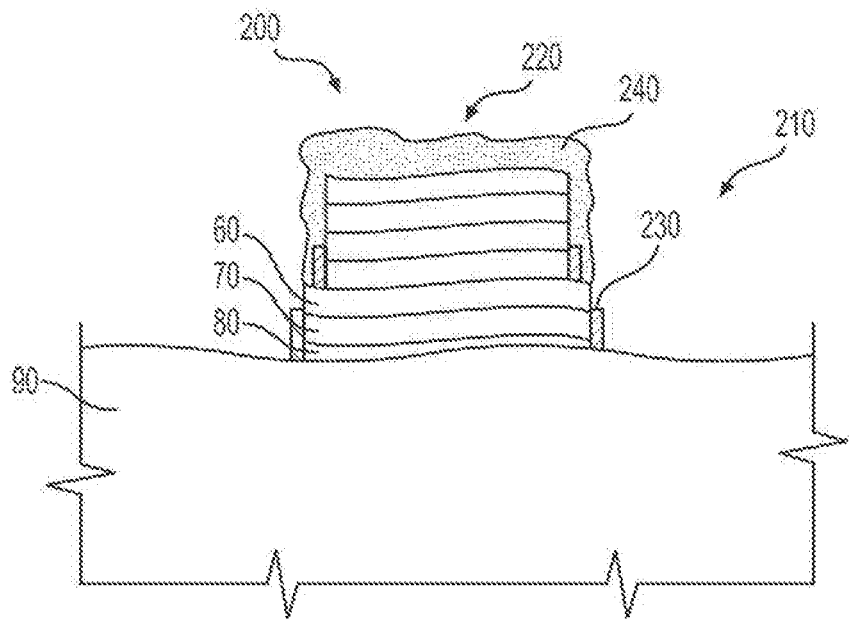

FIG. 5D illustrates magnetoresistive stack 200 after the remainder of the regions (e.g., regions 60, 70, and 80) at the base of the partial etched-region 210' have been etched to form multiple MTJ bits 220 separated by etched-regions

210. As illustrated in FIG. 5D, a portion of the etched material (from the regions of the stack at the base of the partial etched-region 210') may be redeposited on the side walls of the etched-region to form a second redeposited layer 230'. However, as discussed previously with reference to the processing of magnetoresistive stack 100, the second redeposited layer 230' may not cause shorting issues and may be left on the side walls. Nevertheless, in some embodiments, the second redeposited layer 230' may be removed in an optional angled etch or another suitable process, or may be passivated by subjecting the MTJ bits 220 to a suitable chemical process.

Figure 5E:
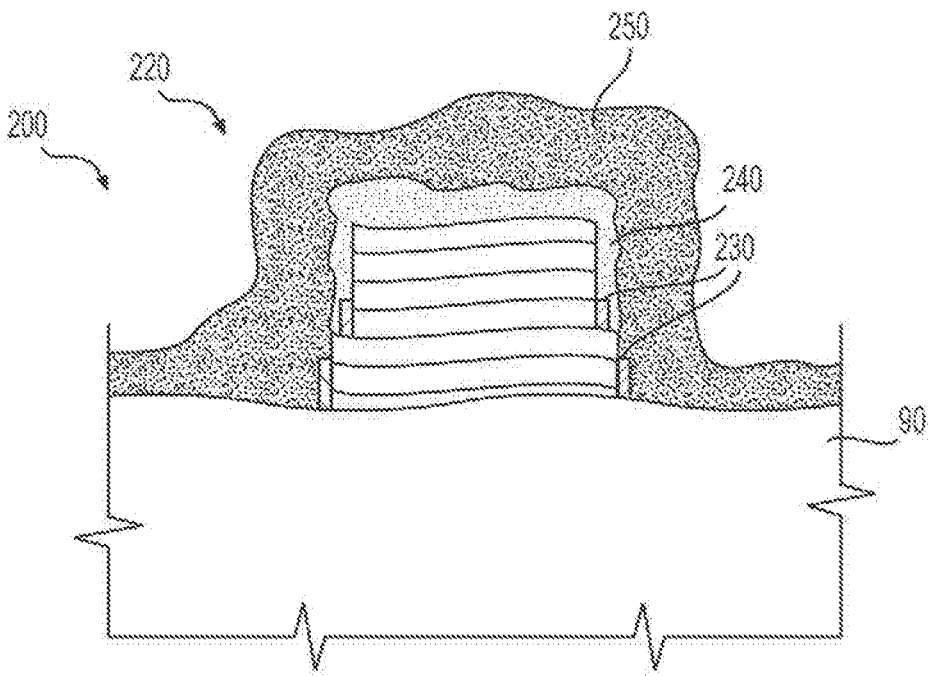

Next, a second encapsulant 250 may be deposited on the MTJ bit 220 and within etched-regions 210', as illustrated in FIG. 5E, to form a conformal coating over the exposed regions of the bit 220 and the first encapsulant 140. The second encapsulant 250 may be similar in material composition and thickness to the second encapsulant 250. Further, the second encapsulant 250 may partially, substantially, or completely fill etched-regions 210'.

In the description above, two etching steps (i.e., a dual etch process) are used to create MTJ bits 120' and 220'. That is, in a first etching step (partial etching step), partial bits 120', 220' are formed by removing some of the regions (that is, less than all of the regions) of the described magnetoresistive stacks to form a partial etched-region 110', 210' around the partial bits 120', 220'. And, in a second etching step, the remainder of the regions of the described magnetoresistive stacks are removed from the base of the partial etched-region 110', 210' to form the completed MTJ bits 120, 220. However, such a dual etch process is not a requirement. In general, the MTJ bits 120 and 220 may be formed using any number of etching steps, including, e.g., a single step etch process. For example, with reference to magnetoresistive stack 100 of FIG. 1, in some embodiments, in a first partial etching step, only regions 10, 20, and 30 may be removed to form a plurality of partial MTJ bits 120" separated by partial etched-regions 110". That is, the first etching step may be terminated at the beginning of, or within, region 40 using, for example, OES signals during etching. Note that, in a completed MTJ device, region 40 may comprise a dielectric material that serves as a tunnel barrier. In some embodiments, any redeposited layer formed on the sidewalls may be removed or "cleaned" (using, for example, angled etch, etc.), and a first encapsulant 140 may be applied over the partial MTJ bits 120" to cover them. In some embodiments, the step of cleaning the redeposited layer may be eliminated.

FIG. 6A illustrates a schematic view of the partial MTJ bits 120" covered or coated by the first encapsulant 140. The first encapsulant 140 coating on these partial MTJ bits 120" may then be used as a spacer to etch addition regions (e.g., regions 40-80) of the stack at the base of the partial etched-regions 110" in one or more additional partial etch steps. For example, as illustrated in FIG. 6B, a second etch step may be used to remove only regions 40 and 50 (i.e., by terminating the second etch at the beginning of, or within, region 60) from the base of the partial etched-region 110" to form partial MTJ bits 120" separated by partial etched-regions 110". Note that, in a completed MTJ device, region 60 may also comprise a dielectric material that serves as a tunnel barrier. In some embodiments, regions 40 and 50 may be etched by only using the deposited first encapsulant 140 as a mask (i.e., etched without additional photoresist patterning).

A second encapsulant 150 may then be deposited on the partial MTJ bits 120" (see FIG. 6B). The second encapsulant 150 may partially, substantially, or completely fill etched-regions 110". A third etch step may then be used to etch the remainder of the regions of the stack (e.g., regions 60, 70, and 80) at the base of the partial etched-region 110" to form MTJ bits 120" separated by etched-regions 110". As illustrated in FIG. 6C, a third encapsulant 160 may then be used to coat the MTJ bits 120. Any of the previously described materials for the first and second encapsulants may be used as the first, second, and third encapsulants 140, 150, and 160 of FIG. 6C. As illustrated in FIGS. 6A-6C, each of the etching steps may result in some of the etched material being redeposited as a redeposited layer 130, 130', or 130" on the side walls of the resulting etched structure. In some embodiments, some or all of these redeposited layers, 130', or 130" may be removed (e.g., by using an angled etch or another suitable process) prior to depositing the next encapsulant material. However, in some embodiments, these redeposited layers 130, 130', or 130" may not be removed. Since a height of the redeposited layers 130, 130', or 130" within an associated etched-region 110" is expected to be small, and since the redeposited layers 130, 130', or 130' are electrically separated from each other by the described encapsulants, they are not expected to cause electrical shorting or magnetic issues if they are not removed from the side walls of MTJ bit 120". In some embodiments, some or all of redeposited layers 130, 130', or 130" on the side walls may be rendered electrically nonconductive by subjecting the MTJ bits 120" to a suitable chemical process (such as, for example, oxidation, nitridization, etc.).

In the description above, the etching steps used to create the partial MTJ bits 120', 120" and 220' are described as being terminated at the beginning of a region (i.e., at the beginning of region 60 in the embodiments of FIGS. 4A and 5A, and the beginning of regions 40 and 60 in the embodiments of FIGS. 6A and 6B). However, this is not a requirement. In general, the etching steps may be terminated anywhere in the region. For example, as illustrated in FIG. 7A, in some embodiments, the etch step used to create the partial MTJ bits 120' of FIG. 4A may be stopped within region 60 (e.g., approximately 10%, 20%, 30%, 50%, 60%, 70%, 80%, 90%, etc. into the thickness of region 60). In embodiments where OES is used to determine when to terminate the etch step, the etch step may be terminated based on the strength of the OES signals (e.g., by comparing the strength of the OES signals corresponding to the materials of region 60 to a threshold value, etc.). In some embodiments, as illustrated in FIG. 7B, the etch step (of FIG. 4A) may be terminated at or proximate the end of region 60. That is, for example, when OES indicates a predetermined reduction in the strength of the signals corresponding to the materials of region 60. It is also contemplated that, in some embodiments, the etch step (illustrated in FIG. 7B) may only be stopped at the beginning of region 70 (i.e., after all of region 60 has been etched). As described previously, after forming the MTJ bits 120, 220 using the above-described fabrication processes, further processes may be carried out to form MTJ devices.

It should be noted that, although the partial etch or the first etch in the embodiments described above (see FIGS. 4A, 5A, 6B, etc.) is terminated at region 60 (at the beginning of region 60, within region 60, at the end of region 60, immediately after region 60, etc.), this is not a limitation. In general, the multiple etch steps described above can be terminated at any region (e.g., region 50, 60, 70, etc.). However, when etching a multi-layer assembly comprising a plurality of electrically conductive and electrically insulating layers, terminating the partial etch at an electrically insulating layer may be advantageous because, after the magnetoresistive device (e.g., MTJ bit 120 of FIG. 4E) is formed, the electrically insulating layer (e.g., region 60 of FIG. 4E) separates and insulates from each other, the redeposited layers formed during the multiple etch steps and minimizes the likelihood of electrical shorting.

As explained above, in general, the partial etch step may be stopped anywhere in any region of the magnetoresistive stack. For example, in embodiments where the magnetoresistive stack is etched by subjecting the stack to alternating straight etching and angled etching (and/or chemical processing) steps (e.g., of a fixed duration), the location in the stack where the etch terminates may not be controlled. Instead, the straight etching process may be continued for a predetermined time (e.g., 10 seconds, 20 seconds, 30 seconds, 40 seconds, etc.). After straight etching for the predetermined time, the ion beam or the wafer may be tilted (e.g., such as, $30 \geq \theta < 90°$, as shown in FIG. 4B), and angled etching continued for a predetermined time (the same or a different amount of time) to remove the redeposited layer on the side walls formed during the previous etching steps. Additionally or alternatively, after straight etching for a predetermined time, the wafer may be subject to a chemical process (e.g., plasma oxidation) to render the redeposited layer on the side walls electrically non-conductive. The straight etching process may then be continued by tilting the ion beam and or the wafer back such that angle $\theta$ is between about 0° and less than about 30° (see FIG. 3).

As alluded to above, the MTJ devices (formed using MTJ bits 120, 220 from MTJ stacks 100, 200) may include a sensor architecture or a memory architecture (among other architectures). For example, in an MTJ device having a memory configuration, the MTJ bits 120, 220 may be electrically connected to an access transistor and configured to couple or connect to various conductors, which may carry one or more control signals, as shown in FIG. 8. The MTJ devices may be used in any suitable application, including, e.g., in a memory configuration. In such instances, the MTJ devices may be formed as integrated circuits comprising a discrete memory device (e.g., as shown in FIG. 9A) or an embedded memory device having a logic therein (e.g., as shown in FIG. 9B), each including MRAM, which, in one embodiment is representative of one or more arrays of MRAM having a plurality of magnetoresistive stacks/structures, according to certain aspects of certain embodiments disclosed herein.

An exemplary method of fabricating a selected embodiment of magnetoresistive device (e.g., an MTJ bit) will now be described. It should be appreciated that the described method is merely exemplary. In some embodiments, the method may include a number of additional or alternative steps, and in some embodiments, one or more of the described steps may be omitted. Any described step may be omitted or modified, or other steps added, as long as the intended functionality of the magnetoresistive device remains substantially unaltered. Although a certain order is described or implied in the described method, in general, the steps of the described method need not be performed in the illustrated and described order. Further, the described method may be incorporated into a process of fabricating an MTJ bit from the described magnetoresistive device. Since the additional steps needed to form MTJ bits are known to people skilled in the art, they are not described herein. Additionally, the described method may be incorporated into a more comprehensive procedure or process having additional functionality not described herein.

FIG. 10 depicts a flow chart of an exemplary method 300 of fabricating a magnetoresistive device (e.g., an MTJ bit) from a magnetoresistive stack, e.g., magnetoresistive stack 100 described above. For the sake of brevity, the exemplary method will describe fabricating MTJ bit 120 (of FIGS. 4A-4E) from magnetoresistive stack 100 (of FIG. 1), referencing previously described aspects (materials, fabrication processes, dimensions, etc.) of these embodiments. A magnetoresistive stack may first be provided (step 310). Providing the magnetoresistive stack may include sequentially depositing (and/or growing, sputtering, etc.) the multiple regions (of magnetoresistive stack 100), and processing (e.g., annealing, etc.) the deposited regions to form magnetoresistive stack 100. In some embodiments, this step may include using a magnetoresistive stack 100 that was previously formed. The method also includes partially etching through the thickness of the magnetoresistive stack 100 to form a partial magnetoresistive device, e.g., an MTJ bit (step 320). In some embodiments, this step may include using known lithographic techniques (photoresist, photolithography, etc.) to expose selected regions of the magnetoresistive stack 100, and etching through multiple regions of the stack (e.g., less than all the regions) to form a plurality of partial magnetoresistive devices, e.g., MTJ bits 120', separated by partial etched-regions 110' (see FIG. 4A). Etching may be performed using any suitable technique (for example, straight etching using physical etching such as ion beam etching, reactive ion beam etching, etc.). In some embodiments, the partial etch of step 320 may be terminated at the beginning of region 60, for example, by monitoring OES signals during the etching. However, as described previously, in other embodiments, the partial etch of step 320 may be terminated at other locations (e.g., other regions of the stack, other locations of regions 60 (such as, within region 60, at the end of region 60, immediately after region 60, etc.)).

In some embodiments, the redeposited layer 130 formed on the side walls of the partial MTJ bits 120' (after the partial etch step of 320) may then be removed (step 330) (see FIG. 4B). Any known process, such as, for example, an angled ion beam etch, may be used to remove at least a portion of this redeposited layer 130. In some embodiments, step 330 may be omitted. In some embodiments, instead of step 300 or in addition to step 330 (before or after step 330), any redeposited layer 130 on the side walls of the partial MTJ bits 120' may be rendered electrically nonconductive by subjecting the MTJ bits 120' to a suitable chemical process (e.g., oxidation, nitridization, etc.). A first encapsulant 140 may be deposited on the partial MTJ bits 120' to cover the bits 120', including their side walls (step 340) (see FIG. 4C). Any suitable process (CVD, ALD, etc.) may be used to deposit the first encapsulant 140 on the partially etched magnetoresistive stack 100. The first encapsulant 140 may then be used as a spacer to continue etching the remaining regions of the magnetoresistive stack 100 at the base of the partial etched-region 110' to convert the partial MTJ bits 120' to MTJ bits 120 (step 350) (see FIG. 4D). In some embodiments, step 340 may be eliminated and step 350 may be carried out without the first encapsulant 140 covering the partial MTJ bits 120'. The etching may be performed using any suitable technique (for example, physical etching such as ion beam etching, reactive ion beam etching, etc.). In some embodiments, a second redeposited layer 130' formed on the side walls of the MTJ bits 120' after step 350 may then be removed (e.g., by angled etching). However, in some embodiments, this step may be omitted. In some embodiments, any remaining second redeposited layer 130' on the side walls of the MTJ bits 120' (before or after angled etching) may be rendered nonconductive by exposing the MTJ bits 120' to a suitable chemical process (e.g., oxidation, nitridization, etc.). A second encapsulant 150 may then be deposited on the MTJ bits 120' (step 360) (see FIG. 4E). Further processing (polishing to expose the MTJ bits, forming bit contact structures to make electrical contact with the bits, etc.) may then be carried out to fabricate an MTJ device using the MTJ bits 120'.

In one embodiment, a method of fabricating a magnetoresistive bit from a magnetoresistive stack including (i) a first magnetic region, (ii) an intermediate region disposed over the first magnetic region, and (iii) a second magnetic region disposed over the intermediate region, is disclosed. The method may include etching through a first portion of the magnetoresistive stack using a first etch process to form one or more sidewalls, wherein at least a portion of the sidewalls includes redeposited material after the etching. The method may also include modifying at least a portion of the redeposited material on the sidewalls, and etching through a second portion of the magnetoresistive stack after the modifying step.

Various embodiments of the disclosed method may alternatively or additionally include one or more of the following aspects: the modifying step may include removing at least a portion of the redeposited material on the sidewalls using a second etch process; the modifying step may include removing at least a portion of the redeposited material on the sidewalk using a second etch process, and wherein the first etch process and the second etch process include using an ion beam for etching; the modifying step may include removing at least a portion of the redeposited material on the sidewalls using a second etch process, and wherein the first etch process and the second etch process include using an ion beam for etching, and (a) in the first etch process, the ion beams are inclined at an angle between about 0° and less than about 30° with respect to an axis normal to a surface of the magnetoresistive stack, and (b) in the second etch process, the ion beams are inclined at an angle between about 30° and less than 90° with respect to the axis; the modifying step includes rendering at least a portion of the redeposited material on the sidewalls electrically-nonconductive; the modifying step may include rendering at least a portion of the redeposited material on the sidewalls electrically-nonconductive by subjecting the magnetoresistive stack to a chemical process to convert the portion of the redeposited material to an electrically-nonconductive material; the modifying step may include rendering at least a portion of the redeposited material on the sidewalls electrically-nonconductive by subjecting the magnetoresistive stack to one of oxidation or nitridization; the modifying step may include rendering at least a portion of the redeposited material on the sidewalls electrically-nonconductive by subjecting the magnetoresistive stack to plasma oxidation; etching through the first portion may include subjecting the magnetoresistive stack to the first etch process for a first predetermined amount of time, and the modifying step may include subjecting the magnetoresistive stack to a modification process for a second predetermined amount of time after the first etch process to modify the portion of the redeposited material; and the intermediate material includes a dielectric material.

In one embodiment, a method of fabricating a magnetoresistive bit from a magnetoresistive stack including (i) a first magnetic region, (ii) a dielectric region disposed over the first magnetic region, and (iii) a second magnetic region disposed over the dielectric region, is disclosed. The method may include using a first etch process to etch a first portion of the magnetoresistive stack and form one or more sidewalls. At least a portion of the sidewalls may include redeposited material after the first etch process. The method may also include using a second etch process to etch at least a portion of the redeposited material from the sidewalls after etching the first portion. And, etching through a second portion of the magnetoresistive stack using the first etch process after the second etch process.

Various embodiments of the disclosed method may alternatively or additionally include one or more of the following aspects: both the first etch process and the second etch process may use ion beams for etching, and wherein (a) in the first etch process, the ion beams are inclined at an angle between about 0° and less than about 30° with respect to an axis normal to a surface of the magnetoresistive stack, and (b) in the second etch process, the ion beams are inclined at an angle between about 30° and less than 90° with respect to the axis; the method may further include depositing a first encapsulant on the sidewalls after etching at least a portion of the redeposited material from the sidewalls using the second etch process; the method may further include (a) depositing a first encapsulant on the sidewalls after etching at least a portion of the redeposited material from the sidewalls using the second etch process, and (b) depositing a second encapsulant on the magnetoresistive stack after etching through the second portion, the first encapsulant being the same as, or different from, the second encapsulant; the first portion may include substantially an entire thickness of the second magnetic region and at least a portion of the dielectric region; using the first etch process may include subjecting the magnetoresistive stack to the first etch process for a first predetermined amount of time, and using the second etch process includes subjecting the magnetoresistive stack to the second etch process for a second predetermined amount of time, the first predetermined amount of time being the same as, or different from, the second predetermined amount of time.

In one embodiment, a method of fabricating a magnetoresistive bit from a magnetoresistive stack including (i) a first magnetic region, (ii) a dielectric region disposed over the first magnetic region, and (iii) a second magnetic region disposed over the dielectric region, is disclosed. The method may include using a first etch process to etch a first portion of the magnetoresistive stack and form one or more sidewalls, wherein at least a portion of the sidewalls includes redeposited material after the first etch process. The method may also include exposing the magnetoresistive stack to a chemical process to render at least a portion of the redeposited material on the sidewalls electrically nonconductive after etching the first portion. The method may further include etching through a second portion of the magnetoresistive stack after exposing the magnetoresistive stack to the chemical process.

Various embodiments of the disclosed method may alternatively or additionally include one or more of the following aspects: the first etch process may include using ion beams for etching and the chemical process may include one of oxidation or nitridization; the chemical process may include plasma oxidation; the method may further include depositing a first encapsulant on the sidewalls after exposing the magnetoresistive stack to the chemical process.

Although various embodiments of the present disclosure have been illustrated and described in detail, it will be readily apparent to those skilled in the art that various modifications may be made without departing from the present disclosure or from the scope of the appended claims.

What is claimed is:

1. A method of fabricating a magnetoresistive bit from a magnetoresistive stack including (i) a free magnetic region, (ii) a fixed magnetic region, and (iii) an intermediate region disposed between the free magnetic region and the fixed magnetic region, the method comprising:
   (a) etching through a first portion of the magnetoresistive stack to form one or more first sidewalls of the free magnetic region, the fixed magnetic region, and/or the intermediate region, the one or more first sidewalls including a first redeposited material, wherein etching through the first portion of the magnetoresistive stack to form the one or more first sidewalls includes terminating the etching within the intermediate region;
   (b) removing a portion but not all of the first redeposited material and then rendering at least a portion of remaining first redeposited material electrically nonconductive;
   (c) depositing an encapsulation metal on the one or more first sidewalls of the free magnetic region, the fixed magnetic region, and/or the intermediate region;
   (d) nitridizing the encapsulation metal to form a first encapsulation material; and
   (e) etching through a second portion of the magnetoresistive stack.

2. The method of claim 1, wherein rendering at least a portion of remaining first redeposited material electrically non-conductive in step (b) includes subjecting the magnetoresistive stack to a chemical process.

3. The method of claim 1, wherein rendering at least a portion of remaining first redeposited material electrically non-conductive in step (b) includes subjecting the magnetoresistive stack to an oxidation process.

4. The method of claim 1, wherein rendering at least a portion of remaining first redeposited material electrically non-conductive in step (b) includes subjecting the magnetoresistive stack to a nitridization process.

5. The method of claim 1, wherein rendering at least a portion of remaining first redeposited material electrically non-conductive in step (b) includes subjecting the magnetoresistive stack to plasma oxidation.

6. The method of claim 1, wherein step (a) includes an ion beam etching process.

7. The method of claim 1, wherein the first encapsulation material includes at least one of an oxide or a nitride.

8. The method of claim 1, wherein step (e) forms one or more second sidewalls, the one or more second sidewalls including a second redeposited material, and wherein the method further comprises:
   depositing a second encapsulation material on the etched magnetoresistive stack after step (e) and without removing the second redeposited material.

9. The method of claim 1, wherein step (e) forms one or more second sidewalls, the one or more second sidewalls including a second redeposited material, and wherein the method further comprises:
   depositing a second encapsulation material on the etched magnetoresistive stack after step (e) and after removing the second redeposited material.

10. The method of claim 1, wherein step (e) forms one or more second sidewalls, the one or more second sidewalls including a second redeposited material, and wherein the method further comprises:
    depositing a second encapsulation material on the etched magnetoresistive stack after step (e) and after rendering the second redeposited material electrically non-conductive.

11. The method of claim 1, wherein the encapsulation metal comprises aluminum or magnesium.

12. A method of fabricating a magnetoresistive bit from magnetoresistive stack including (i) a first magnetic region, (ii) an intermediate region disposed over the first magnetic region, and (iii) a second magnetic region disposed over the intermediate region, the method comprising:
    (a) etching through a first portion of the magnetoresistive stack to form one or more sidewalls, the one or more sidewalls including a redeposited material after the etching, wherein the etching through the first portion of the magnetoresistive stack to form one or more sidewalls includes terminating the etching within the intermediate region;
    (b) modifying at least a portion of the redeposited material, wherein the modifying step includes rendering at least a portion of the redeposited material electrically nonconductive;
    (c) depositing a first encapsulation metal on the etched magnetoresistive stack after step (b);
    (d) nitridizing the first encapsulation metal to form a first encapsulation material;
    (e) etching through a second portion of the magnetoresistive stack, wherein etching through the second portion of the magnetoresistive stack forms one or more etched regions; and
    (f) depositing a second encapsulation material on the etched magnetoresistive stack after step (e), wherein depositing the second encapsulation material includes depositing the second encapsulation material to at least partially fill the one or more etched regions;
    wherein the second encapsulation material includes a nitride.

13. The method of claim 12, wherein step (b) includes removing at least the portion of the redeposited material.

14. The method of claim 12, wherein step (b) includes subjecting at least the portion of the redeposited material to a chemical process.

15. The method of claim 12, wherein step (b) includes removing at least the portion of the redeposited material and subjecting remaining redeposited material to a chemical process.

16. The method of claim 12, wherein step (e) forms one or more additional sidewalls, and step (f) includes depositing the second encapsulation material on the one or more additional sidewalls.

17. The method of claim 12, wherein step (b) includes an angled etch process.

18. The method of claim 12, wherein the rendering at least the portion of the redeposited material electrically nonconductive includes subjecting the magnetoresistive stack to nitridization.

19. A method of fabricating a magnetoresistive bit from a magnetoresistive stack including (i) a free magnetic region, (ii) a fixed magnetic region, and (iii) an intermediate region disposed between the free magnetic region and the fixed magnetic region, the method comprising:
    (a) etching through a first portion of the magnetoresistive stack to form one or more first sidewalls of the free magnetic region, the fixed magnetic region, or the intermediate region, wherein the etching terminates within a portion of the intermediate region, and wherein the one or more first sidewalls include a first redeposited material;
    (b) removing a portion but not all of the first redeposited material;

(c) depositing a first encapsulation metal on the etched magnetoresistive stack;
(d) nitridizing the first encapsulation metal to form a first encapsulation material, wherein the first encapsulation material is electrically nonconductive;
(e) etching through a second portion of the magnetoresistive stack, wherein etching through the second portion of the magnetoresistive stack forms one or more etched regions; and
(f) depositing a second encapsulation metal on at least a portion of the magnetoresistive bit, wherein the second encapsulation metal at least partially fills the one or more etched regions.

20. The method of claim 19, wherein the first encapsulation metal comprises aluminum or magnesium.

21. The method of claim 19, wherein step (b) includes an angled etch process.

22. The method of claim 19, wherein step (b) includes subjecting at least the portion of the redeposited material to a chemical process.

* * * * *